(12) United States Patent
Koole et al.

(10) Patent No.: US 10,578,257 B2
(45) Date of Patent: Mar. 3, 2020

(54) SILICA COATED QUANTUM DOTS WITH IMPROVED QUANTUM EFFICIENCY

(71) Applicant: Lumileds LLC, San Jose, CA (US)

(72) Inventors: Roelof Koole, Eindhoven (NL); Patrick John Baesjou, Eindhoven (NL); Marcel Rene Bohmer, Eindhoven (NL); Joep Lodewijk Peters, Eindhoven (NL)

(73) Assignee: LUMILEDS LLC, San Jose, CA (US)

( * ) Notice: Subject to any disclaimer, the term of this patent is extended or adjusted under 35 U.S.C. 154(b) by 383 days.

(21) Appl. No.: 15/328,751

(22) PCT Filed: Jul. 24, 2015

(86) PCT No.: PCT/EP2015/067026
§ 371 (c)(1),
(2) Date: Jan. 24, 2017

(87) PCT Pub. No.: WO2016/016134
PCT Pub. Date: Feb. 4, 2016

(65) Prior Publication Data
US 2017/0211756 A1    Jul. 27, 2017

(30) Foreign Application Priority Data

Jul. 28, 2014   (EP) .................................... 14178703

(51) Int. Cl.
*F21K 9/64*        (2016.01)
*C09K 11/56*       (2006.01)
(Continued)

(52) U.S. Cl.
CPC ................ *F21K 9/64* (2016.08); *C09K 11/02* (2013.01); *C09K 11/025* (2013.01);
(Continued)

(58) Field of Classification Search
CPC ..... C09K 11/02; C09K 11/025; C09K 11/565; C09K 11/883; F21V 9/64; F21V 9/30; Y10S 977/774
See application file for complete search history.

(56) References Cited

U.S. PATENT DOCUMENTS

| 7,503,676 B2 * | 3/2009 | Sakumoto | ............. C09K 11/02 362/231 |
| 9,334,442 B2 | 5/2016 | Greuel et al. | |

FOREIGN PATENT DOCUMENTS

| CN | 101629076 A | 1/2010 |
| CN | 101717644 A | 6/2010 |

(Continued)

OTHER PUBLICATIONS

Stober, et al. "Controlled Growth of Monodisperse Silica Spheres in the Micron Size Range", Journal of Colloid and Interface Science 26 (1968), pp. 62-69.

(Continued)

*Primary Examiner* — C Melissa Koslow

(57) ABSTRACT

The invention provides a method for the production of a luminescent material, (10) based on coated quantum dots (100), comprising: (i) providing luminescent quantum dots (100) in a liquid medium (20) wherein the luminescent quantum dots (100) have an outer layer (105) comprising first cations and first anions; and (ii) providing in a coating process a coating (120) on the outer layer (105) of the quantum dots (100) in the liquid medium (20), wherein the coating (120) comprises a silica coating; wherein during the coating process, or after the coating process, or during and after the coating process, the liquid medium (20) comprises one or more of a third element and a fourth element, wherein the first cation and the third element belong to the same group of the periodic system, and wherein the first anion and (Continued)

the fourth element belong to the same group of the periodic system.

17 Claims, 8 Drawing Sheets

(51) Int. Cl.

| | | |
|---|---|---|
| *C09K 11/02* | (2006.01) | |
| *F21V 9/30* | (2018.01) | |
| *C09K 11/88* | (2006.01) | |
| *H01L 33/50* | (2010.01) | |
| *B82Y 30/00* | (2011.01) | |
| *B82Y 40/00* | (2011.01) | |

(52) U.S. Cl.
CPC .......... *C09K 11/565* (2013.01); *C09K 11/883* (2013.01); *F21V 9/30* (2018.02); *B82Y 30/00* (2013.01); *B82Y 40/00* (2013.01); *H01L 33/502* (2013.01); *Y10S 977/774* (2013.01); *Y10S 977/824* (2013.01); *Y10S 977/892* (2013.01); *Y10S 977/95* (2013.01)

(56) References Cited

FOREIGN PATENT DOCUMENTS

| CN | 101805613 A | 8/2010 |
|---|---|---|
| CN | 102925158 A | 2/2013 |
| CN | 103619991 A | 3/2014 |
| CN | 103890134 A | 6/2014 |
| WO | 2005107818 A2 | 11/2005 |
| WO | 2009046392 A1 | 4/2009 |
| WO | 2013057702 A1 | 4/2013 |

OTHER PUBLICATIONS

Osseo-Asare, et al. "Preparation of SIO2 Nanoparticles in a Non-Ionic Reverse Micellar System", Colloids and Surfaces, 50 (1990), pp. 321-339.

"Photometric Quantities" and "Transmission of Corning Colored Filters", CRC Handbook of Chemistry and Physics, 69th Edition (1988-1989), pp. E-208 and E-406.

Ding, et al. "Fe3O4@SiO2 Core/Shell Nanoparticles: The Silica Coating Regulations with a Single Core for Different Core Sizes and Shell Thicknesses", Chemistry of Materials, 2012, vol. 24, pp. 4572-4580.

Extended European Search Report dated Jan. 20, 2015, European Application No. 14178703.6, 6 pages.

EPO as ISA, "International Search Report and Written Opinion" dated Oct. 19, 2015 from International Application No. PCT/EP2015/067026, filed Jul. 24, 2015, 11 pages.

Koole et al., On the Incorporation Mechanism of Hydrophobic Quantum Dots in Silica Spheres by a Reverse Microemulsion Method, Chemistry of Materials, vol. 20, No. 7, Apr. 1, 2008, pp. 2503-2512.

First Office Action dated May 23, 2018, China Patent Application No. 201580040755.7, 21 pages.

\* cited by examiner

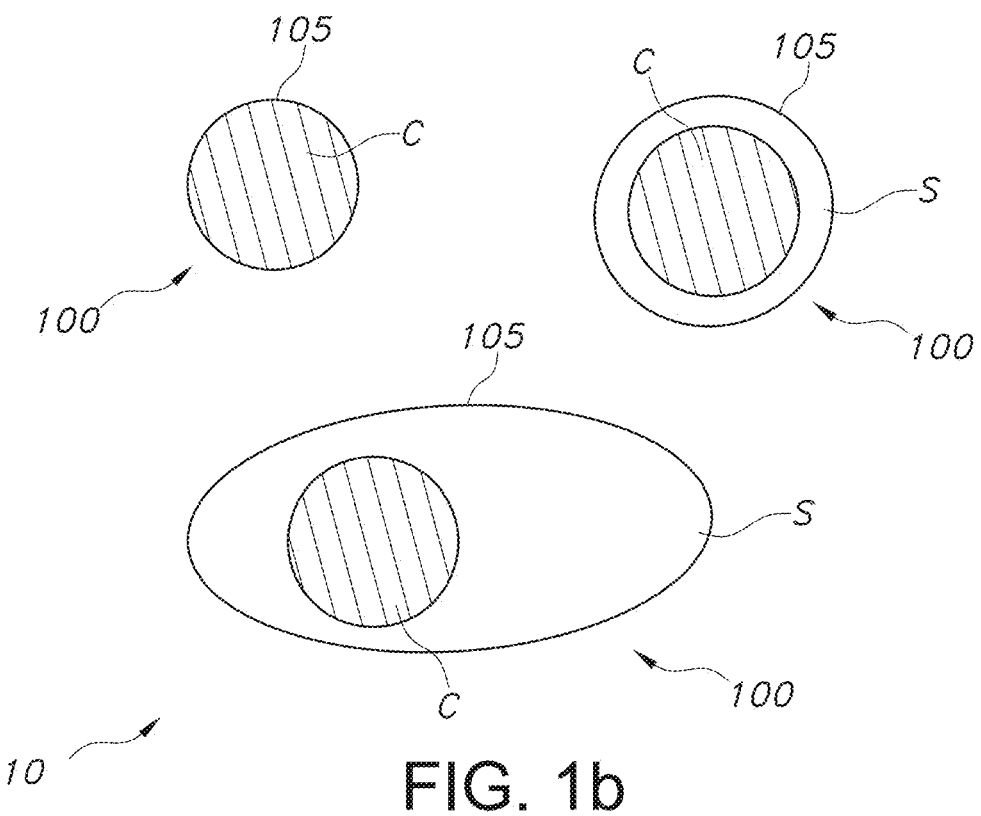
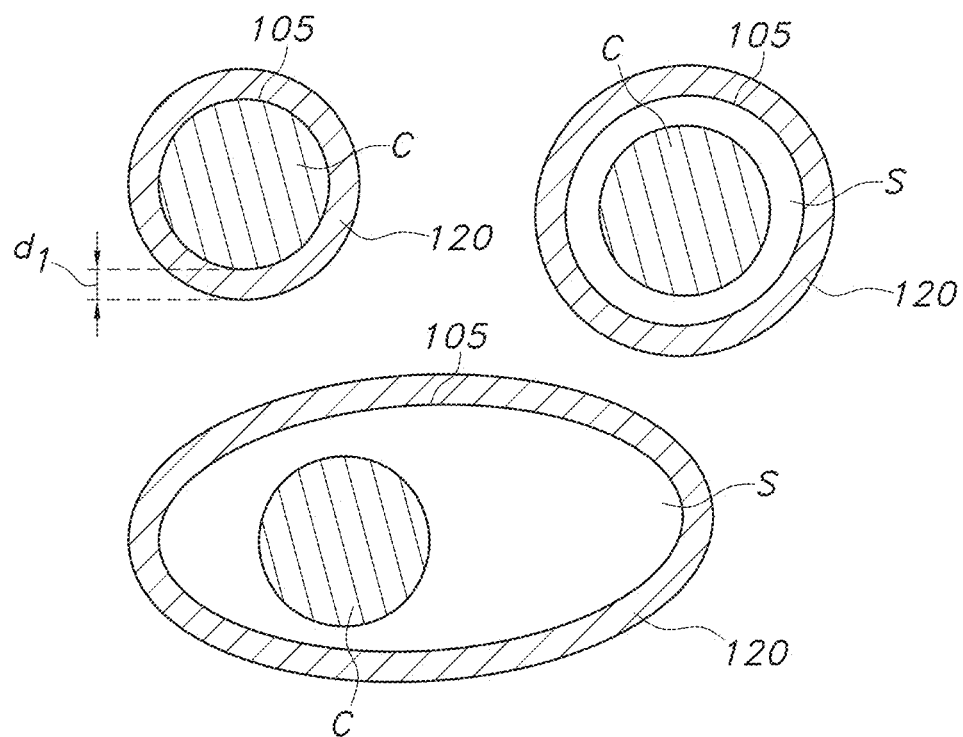
FIG. 1b
FIG. 1c

SILICA COATED QUANTUM DOTS WITH IMPROVED QUANTUM EFFICIENCY

CROSS-REFERENCE TO RELATED APPLICATIONS

The present application is a § 371 application of International Application No. PCT/EP2015/067026 filed on Jul. 24, 2015 and entitled "SILICA COATED QUANTUM DOTS WITH IMPROVED QUANTUM EFFICIENCY," which claims the benefit of European Patent Application No. 14178703.6 filed on Jul. 28, 2014. International Application No. PCT/EP2015/067026 and European Patent Application No. 14178703.6 are incorporated herein.

FIELD OF THE INVENTION

The invention relates to a method for the production of a luminescent material based on quantum dots. The invention further relates to such luminescent material, and also to a wavelength converter element comprising such luminescent material. The invention also relates to a lighting device making use of such luminescent material to provide light. The invention further relates to a lamp and a luminaire comprising said lighting device.

BACKGROUND OF THE INVENTION

Quantum dots (qdots or QDs) are currently being studied as phosphors in solid state lighting (SSL) applications (LEDs). They have several advantages such as a tunable emission and a narrow emission band which can help to significantly increase the efficacy of LED based lamps, especially at high CRI. Typically, qdots are supplied in an organic liquid, with the quantum dots surrounded by organic ligands, such as oleate (the anion of oleic acid), which helps to improve the emission efficiency of the dots as well as stabilize them in organic media.

The synthesis of silica coatings on quantum dots is known in the art. Koole et al. (in R. Koole, M. van Schooneveld, J. Hilhorst, C. de Mello Donegá, D.'t Hart, A. van Blaaderen, D. Vanmaekelbergh and A. Meijerink, Chem. Mater., 20, p. 2503-2512, 2008) describe experimental evidence in favor of a proposed incorporation mechanism of hydrophobic semiconductor nanocrystals (or quantum dots, QDs) in monodisperse silica spheres (diameter ~35 nm) by a water-in-oil (W/O) reverse microemulsion synthesis. Fluorescence spectroscopy is used to investigate the rapid ligand exchange that takes place at the QD surface upon addition of the various synthesis reactants. It was theorized that hydrolyzed TEOS has a high affinity for the QD surface and replaces the hydrophobic amine ligands, which enables the transfer of the QDs to the hydrophilic interior of the micelles where silica growth takes place. By hindering the ligand exchange using stronger binding thiol ligands, the position of the incorporated QDs could be controlled from centered to off-center and eventually to the surface of the silica spheres. They were able to make QD/silica particles with an unprecedented quantum efficiency of 35%.

WO2013/057702 describes a luminescent nano particles based luminescent material comprising a matrix of interconnected coated luminescent nano particles, wherein for instance wherein the luminescent nano particles comprise CdSe, wherein the luminescent nano particles comprise a coating of CdS and wherein the matrix comprises a coating comprising ZnS. The luminescent material according may have a quantum efficiency of at least 80% at 25° C., and having a quench of quantum efficiency of at maximum 20% at 100° C. compared to the quantum efficiency at 25° C.

WO2005/107818 describes fluorescent, radio-opaque and magnetic quantum nanoparticles, useful as multifunctional contrast agents or probes for in vivo bio imaging, and methods of their use. The document describes the use for multifaceted bio imaging (e.g., intra-arterial pre-operative brain mapping and broad based in vivo diagnostic imaging), including imaging of various cell types, such as stem cells.

WO2009/046392 describes methods for preparing rare earth doped monodisperse, hexagonal phase upconverting nanophosphors, the steps of which include: dissolving one or more rare earth precursor compounds and one or more host metal fluoride compounds in a solvent containing a tri-substituted phosphine or a tri-substituted phosphine oxide to form a solution; heating the solution to a temperature above about 250° C. at which the phosphine or phosphine oxide remains liquid and does not decompose; and precipitating and isolating from the solution phosphorescent hexagonal phase monodisperse nanoparticles of the host metal compound doped with one or more rare earth elements. Nanoparticles and methods for coating rare earth doped upconverting nanophosphors with $SiO_2$ are also described.

SUMMARY OF THE INVENTION

Silica encapsulation of QDs, see also above, is used to stabilize the QDs in air and to protect them from chemical interactions with the outside. The reverse micelle method was introduced in the 90's as a method to make small (~20 nm) silica particles with a small size dispersion (see below). This method can also be used to make silica-coated QDs. The native organic ligands around QDs are replaced by inorganic silica precursor molecules during the silica shell growth. The inorganic silica shell around QDs has the promise to make QDs more stable against photo-oxidation, because the organic ligands are seen as the weak chain in conventional (e.g. oleic acid or hexadecylamine) capped QDs.

Though prior art mentions high quantum efficiencies of quantum dots, especially when coordinated by organic ligands in an organic medium, it appears that for useful applications where the quantum dots are provided as particulate material, the quantum efficiencies dramatically decrease.

It appeared that the quantum efficiency typically drops by more than 50% upon silica growth, which makes it not applicable for lighting applications. In addition, assuming a silica coating, silica as grown by the reverse micelle method is very porous, making it a less good barrier against oxygen or water than sometimes suggested.

Hence, it is an aspect of the invention to provide an alternative luminescent material, based on quantum dots, which preferably further at least partly obviate one or more of above-described drawbacks. Yet it is also an aspect of the invention to provide an alternative method for the production of such luminescent material based on quantum dots. It is further an aspect of the invention to provide an alternative wavelength converter and/or alternative lighting device, using such quantum dots, which preferably further at least partly obviate one or more of above-described drawbacks.

Herein, it is proposed to add inorganic salts, such as—but not limited—to $ZnCl_2$ or $Na_2S$, during the shell growth. This appears to greatly improve the final QE of QDs after shell growth. Alternatively or in addition, it is proposed to add such salts after the silica (coating) growth. Also this can improve the QE and influences peak wavelength and photo brightening effects of the QDs. With the present method, QD's can be obtained having efficiencies that are suitable or come close to commercial applications, such as e.g. in backlighting.

In a first aspect, the invention provides a method for the production of a luminescent material based on coated quantum dots ("QDs"), the method comprising: (i) providing luminescent quantum dots in a liquid medium wherein the luminescent quantum dots have an outer layer comprising first element (M1) comprising cations and second element (A2) comprising anions; and (ii) providing in a coating process a coating on the outer layer of the quantum dots in the liquid medium, wherein the coating especially comprises a silica coating; wherein during the coating process, or after the coating process, or during and after the coating process, the liquid medium comprises one or more of a third element (M3) comprising ion and a fourth element (A4) comprising ion, wherein in a specific embodiment the first element (M1) and the third element (M3) belong to the same group of the periodic system, and wherein in a specific embodiment the second element (A2) and the fourth element (A4) belong to the same group of the periodic system. Especially, the first element comprising ions are metal cations, such as divalent zinc. Further, especially the second element comprising ions are non-metal anions, such as sulfide or selenide. Note that the term element herein does not indicate that elemental material is applied (like e.g. the Zn element/metal or the S element). In general the elements will be available or will be provided as ions comprising such element(s), like $Zn^{2+}$, $Cd^{2+}$, or $S^{2-}$, $Se^{2-}$, $Te^{2-}$, etc.

The invention also provides in a further aspect the luminescent material, obtainable with such method. Hence, in (yet) a further aspect, the invention also provides luminescent material based on coated quantum dots, the luminescent material comprising luminescent quantum dots having an outer layer comprising first element (M1) comprising cations and second element (A2) comprising anions; and a coating arranged on said outer layer, wherein the coating especially comprises a silica coating, and wherein the (silica) coating further comprises one or more of a third element (M3) and a fourth element (A4), wherein the first element (M1) and the third element (M3) may in an embodiment belong to the same group of the periodic system, and wherein the second element (A2) and the fourth element (A4) may in an embodiment belong to the same group of the periodic system. Especially, the coating comprises a silica ($SiO_2$) coating. Alternatively or additionally, the coating may comprise a titania ($TiO_2$) coating, an alumina ($Al_2O_3$) coating, or a zirconia ($ZrO_2$) coating. Especially, here below the invention is described with respect to a coating comprising a silica coating.

With this method, quantum dot based luminescent material was obtained in the lab with quantum efficiencies even well above 70% (in air). Further, also quantum dots embedded in matrices in practice did not appear to have such high QE's. The present method seems to provide for the first time particulate quantum dots and/or quantum dots in matrices having interestingly high quantum efficiencies. It is theorized that, assuming a zinc sulfide outer layer at the QD (such as when assuming a ZnSe quantum dot, or a CdS core/ZnS shell quantum dot), zinc-containing ligand and/or sulphur-containing ligand complexes may leave the QD surface during silica shell growth, causing trap states that reduce QE. By adding e.g. zinc and/or sulphide salts during and/or after silica shell growth, these traps states may be recovered. Hence, the one or more of a third element (M3) comprising ion and a fourth element (A4) comprising ion are especially applied to improve the quantum efficiency and/or stability. Further, it surprisingly appears that the addition of salts may not only increase QE, but also stability against high temperature or blue flux improves.

Quantum dots may be provided as bare particles, or may e.g. be provided as core-shell particles. The term "shell" may also refer to a plurality of shells. Further, core-shell particles are not necessarily spherical; they may e.g. also be of the quantum rod type or tetrapod type (or other multipod type), etc. Further examples are provided below. The bare particle or core is especially the optically active part. The shell is used as a kind of protection and often comprises a similar type of material, such as a ZnSe core and a ZnS shell (see also below). Such particles are commercially available in organic liquids, with organic ligands attached to such particles for better dispersion. Herein, the outer layer of the particle is the layer most remote from a central part of the bare particle or the core. In the case of a ZnS shell, this outer layer would be the ZnS surface of the QD. The invention is, however, not limited to quantum dots whit a ZnS shell and a ZnSe core. Below, a number of alternative quantum dots are described. Hence, the term "quantum dot" especially refers to a quantum dot particle, which may thus be a bare particle, or a core shell particle, and which may comprise a dot, a rod, etc. As known in the art, a rod in general has a quantum dot incorporated in a rod structure, such as a ZnSe dot in a ZnS rod. Hence, in the case of a "simple" ZnSe or CdS quantum dot, the outer layer will substantially comprise ZnSe and CdS, respectively. Would however core-shell QDs be applied, such as ZnSe with a ZnS shell, or CdS with a ZnS shell, then the outer layer will substantially comprise ZnS (in both embodiments).

Therefore, in an embodiment wherein the quantum dots are not of the core-shell type, but essentially consist of a single material without a shell, the core is of the M1-A2 type, i.e. the core comprises M1 and A2, wherein M1-A2 especially represent any relevant semiconducting material that can be used as QD, see e.g. all examples below. Hence, here the outer layer is substantially identical to the remainder of the QD (core).

In case the QD is of the core-shell type, both the core and the shell may comprise M1-A2, but either M1 or A2, or both M1 and A2 of the shell differ from M1 and A2 of the core. For instance, a ZnSe core with a ZnS shell. Here, the shell is the outer layer. Hence, M1 and A2 refer to the cation(s) and anion(s), respectively, of the outer layer.

On such an outer layer, a (silica) coating may be provided, thereby providing a bare quantum dot with a (silica) coating or a core-shell quantum dot with a (silica) coating. Coating quantum dots with silica results in replacement of the organic ligands by silica precursor molecules, which may act as more (light and/or temperature) stable inorganic ligands. In addition, the silica layer may form a protective barrier against e.g. photo-oxidative species. Especially, the coating entirely covers the outer layer. Suitable methods to provide silica coatings around QDs are amongst others described by Koole et al. (see above), and references cited therein. The synthesis of silica particles without nanoparticles enclosed was first developed by Stober et al (J. Colloid Interface Sci. 1968, 62), which allows the growth of silica spheres of uniform size and shape in e.g. an ethanol phase. The second method of making silica spheres uses micelles in an apolar phase and is called the reverse micelle method (or reverse micro emulsion method), and was first suggested by Osseo-Asare, J. Colloids. Surf. 1990, 6739). The silica particles are grown in defined water droplets, which results in a uniform size distribution which can be controlled quite easily. This approach was extended by introducing nanoparticles in the silica. The main advantage of this approach compared to the Stober method, is that both hydrophobic and hydrophilic particles can be coated, no ligand exchange on forehand is required and there is more control over the particles size and size dispersion.

The present invention is not limited to one of these methods. However, in a specific embodiment the coating process is executed in micelles containing said quantum dots, especially using the reverse-micelle method, as also discussed in Koole et al., which is herein incorporated by reference. Hence, the coating process is especially a process wherein the coating, especially an oxide coating, even more especially a silica coating, is provided to the outer layer of the QD, and which coating process is especially performed in micelles, wherein the QD is exposed to the (silica) precursor with the aid of micelles (containing e.g. water and ammonia as a non-continuous phase in the continuous (non-polar) liquid medium), to provide said silica coating. A micelle may especially be defined as an aggregate of surfactant molecules dispersed in a liquid medium. A typical micelle in aqueous solution forms an aggregate with the hydrophilic "head" regions in contact with surrounding solvent, sequestering the hydrophobic single-tail regions in the micelle center. A reverse micelle is the other way around, using an apolar solution and where the hydrophilic "heads" are pointing inwards and the hydrophobic tail regions are in contact with the apolar medium. As indicated elsewhere, instead of silica, also other coatings may be provided using a coating precursor for such coating.

As indicated above, the availability of the cations and/or anions, other than those of the silica/silicate appears to have a positive influence on quantum efficiency and/or stability of the QDs. It appears that the use of cations and anions similar to those used in the outer shell of the original qdots is most beneficial. For instance, when using a ZnS shell quantum dot, the use of Zn and/or S ions appeared to be beneficial whereas the use of Na (or K) and Cl as ions appeared to have no positive effect.

Hence, especially the first element (M1) and the third element (M3) belong to the same group of the periodic system and/or the second element (A2) and the fourth element (A4) belong to the same group of the periodic system. This phrase does not imply that in each embodiment both a similar cation and a similar anion as QE improver material have to be applied. As indicated above, during the coating process, or after the coating process, or during and after the coating process, the liquid medium may comprise one or more of a third element (M3) comprising ion and a fourth element (A4) comprising ion. For instance, assuming again a ZnS outer layer, only $ZnCl_2$ may be applied during and/or after the coating process, or only $Na_2S$ may be applied during and/or after the coating process.

Further, especially the third element and/or fourth element are selected from the periods 3-5, even more especially 4-5, and especially, when M3≠M1 and A4≠A2, M3 and/or A4 are selected from a period above (if any) or a period below (if any) of M1 and A2, respectively. For instance, again assuming a ZnS outer layer, M3 may especially be Cd and/or A4 may especially be Se. The terms third element and fourth element may in embodiments (independently) also refer to a combination of different third elements and a combination of different fourth elements, respectively.

Hence, in a specific embodiment one or more of the following applies: M3=M1 and A4=A2, as this may especially give good results. The terms "third element" or "fourth element" may also refer to a plurality of different third elements or fourth elements, respectively. For instance, assuming a ZnS outer layer, the third element may for instance include one or more of the zinc cation and the cadmium cation, and the fourth element may for instance include one or more of the sulphide anion and the selenide or telluride anion, respectively. In such embodiments, the fourth element (A4) comprising ion is selected from e.g. the group consisting of the sulphide anion and the selenide or telluride anion. Likewise, the terms "third element (M3) comprising ion" and "fourth element (A4) comprising ion" may in embodiments (independently) also refer to a combination of different third element (M3) comprising ions or a combination of different fourth element (A4) comprising ions, respectively.

In yet a further specific embodiment, M1 and M3 are each independently selected from the group consisting of Zn and Cd, and A2 and A4 are each independently selected from the group consisting of S, Se and Te, more especially independently selected from the group consisting of S and Se. This may e.g. correspond to QDs essentially consisting of ZnS, ZnSe, CdS, CdSe, etc. This may also correspond to core-shell quantum dots, wherein the shell essentially consist of ZnS, ZnSe, CdS, CdSe, etc.; the core may e.g. comprise CdS, ZnSe, InP, etc. Note that when core-shell QDs are described, the chemical composition of the core and the shell will especially be different.

The coating process can e.g. be stopped when the coated quantum dots are precipitated or removed from the liquid medium (such as cyclohexane). Further, the coating process may self-terminate when the coating process is substantially ready. This may sometimes take days. Thereafter, the quantum dots can be washed with (another) liquid medium. In principle, the treatment with the quantum efficiency enhancing ions may also be executed with the washing liquid, or after washing, in another liquid. However, especially the treatment with one or more of these ions is executed before the washing procedure, i.e. in general in the same liquid medium as wherein the coating or silica growth process is executed. This liquid medium, wherein the coating process is executed (in the micelle), is especially an apolar organic solvent, such as pentane, hexane, heptane, etc., including any isomer thereof, such as cyclohexane, etc. In the apolar liquid medium, micelles are formed by nonionic or ionic surfactants, enclosing small water/ammonia droplets. The oxide, especially silica, growth takes place within these small water droplets. Further, as indicated above during the coating process (such as in the micelle), or after the coating process, or during and after the coating process, the liquid medium may comprise one or more of a third element (M3) comprising ion and a fourth element (A4) comprising ion. In a specific embodiment, good results can be obtained when during the coating process the liquid medium comprises the third element (M3) comprising ion and does substantially not comprise the fourth element (A4) comprising ion, and wherein after the coating process the liquid medium comprises the fourth element (A4) comprising ion.

However, the combination of salts and/or the sequence of the salts may also depend upon the type of chemicals and liquids used during the coating process. The third element (M3) comprising ion and fourth element (A4) comprising ion are added to the growth medium typically as a solution in water and will therefore be part of the small water droplets surrounded by the surfactants, in which silica growth takes place. Optionally, before introduction of the fourth element, the liquid medium may be replaced with another liquid medium (substantially not comprising the third element). In other embodiments, wherein during the coating process the liquid medium comprises the fourth element and does substantially not comprise the third element, and wherein after the coating process the liquid medium comprises the third element, also before introduction of the third element, the liquid medium may be replaced with another liquid medium (substantially not comprising the fourth element).

The liquid medium wherein the quantum dots are available may thus contain the third element and/or the fourth element (such as in the micelles in said liquid medium). The concentration of the third element and/or the fourth element may be up to saturation of the respective salts that provide the third element and/or the fourth element, respectively. Further, the concentration should especially not be too low to have an effect, especially in case when the second ion(s) are applied after the start of the coating process, or even after the (substantial) termination of the coating process. Hence, in a specific embodiment the one or more of the third element (M3) and the fourth element (A4) are available in the liquid medium in a concentration of at least of 5 mM, such as at least 10 mM, such as at least 20 mM, or even higher, such as at least 0.05 M. Hence, the invention includes a deliberate addition of one or more salts during and/or after the coating process.

It surprisingly appears that the presence of the quantum efficiency enhancing elements (or ions) has not only an effect on the quantum efficiency, but also on the position of the emission wavelength. In general, it appears that the ion induces a shift, with the third element tending to give a red shift, and the fourth element tending to give a blue shift of the emission. The shift of the emission relative to the untreated silica coated QDs can be indicative of the specific process described herein. Hence, in a specific embodiment the coated quantum dots obtainable with the method according to any one of the preceding claims have a luminescence maximum wavelength that is shifted relative to a luminescence maximum wavelength of coated quantum dots obtainable with such method in the absence of the third element (M3) comprising ion and fourth element (A4) comprising ion. Further, as indicated above the presence of the salts during or after the coating process also improves stability against high temperature or blue flux.

After the QDs have been coated and treated with the anions and/or cations, the QDs can be washed. Optionally, they can be redispersed in a liquid ((second) liquid medium), or can be used as such (see also below).

Further, it surprisingly appears that when the liquid medium comprises the fourth element (A4), such as S, Se and/or Te, it may be advantageous to use a basic medium, especially also comprising one or more of NaOH and KOH. Hence, when the fourth element is applied, especially an liquid medium may be applied that is an aqueous medium, such as water comprising $Na_2S$ and NaOH (which will be dissolved, i.e. $Na^+$, $S^{2-}$, and $OH^-$).

The pH used of the basic liquid medium especially be 11 or higher, such as 12 or higher, like even 13 or higher. Especially, the pH of the liquid the particle may experience is (also) at least about 11, such as at least about 12, or even at least about 13.

After the coating (and after the optional washing), the coated quantum dots may in a first embodiment be separated from the liquid material. This can be done with methods known in the art, like filtration, evaporation, etc. The luminescent material obtainable with the method as described herein comprises particulate coated quantum dots. This material may be dried and be converted into particulate material (comprising coated quantum dots). Alternatively, in a second embodiment the coated quantum dots can be redispersed in a liquid ((second) liquid medium). Both materials may be used for embedding the coated quantum dots in a matrix (see below).

Especially however, the method as defined herein may further comprise embedding the coated quantum dots in a host material to provide a wavelength converter element, wherein the host material may especially comprise a silicone (poly siloxanes polymers). However, other host materials may also be possible. Hence, the invention also provides a wavelength converter element comprising a host material with the luminescent material, as described herein, or obtainable by the method according as described herein, embedded therein.

Especially, the host material is transmissive for light, especially UV and/or blue light. The wavelength converter element is especially a transmissive element and may also be indicated as waveguide or light guide. This host material may especially be a transmissive host material, and may be of inorganic or organic character. For instance, the host material may comprise one or more materials selected from the group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), polyvinylchloride (PVC), polyethylene terephthalate (PET), (PETG) (glycol modified polyethylene terephthalate), PDMS (polydimethylsiloxane), PMPS (polymethylphenylsiloxane), and COC (cyclo olefin copolymer). However, in another embodiment the waveguide may comprise an inorganic material. Preferred (in)organic materials are selected from the group consisting of glasses, (fused) quartz, transmissive ceramic materials, and silicones. Also hybrid materials, comprising both inorganic and organic parts may be applied. Especially preferred are PMMA, transparent PC, silicone, or glass as material for the waveguide. Especially, silicone may be of interest, but also PDMS, PMPS, and polysilsesquioxane. Especially, the host material is transmissive for light having a wavelength selected from the range of 380-750 nm. For instance, the host material may be transmissive for blue, and/or green, and/or red light. Especially, the host material is transmissive for at least the entire range of 420-680 nm. Especially, the host material has a light transmission in the range of 50-100%, especially in the range of 70-100%, for light generated by the light source of the lighting unit (see also below) and having a wavelength selected from the visible wavelength range. In this way, the host material is transmissive for visible light from the lighting unit. The transmission or light permeability can be determined by providing light at a specific wavelength with a first intensity to the material and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989). The light converter may be transparent or translucent, but may especially be transparent. Especially, the light converter is substantially transparent and/or does not substantially scatter light. When the light converter is transparent, light of the light source may not entirely be absorbed by the light converter. Especially when using blue light, this may be of interest, as the blue light may be used to excite the QDs or light converter nano particles and may be used to provide a blue component (in white light). Hence, especially curable siloxane polymers are applied that provide a substantially transmissive matrix (or host) for the QDs or light converter nano particles.

In yet another embodiment, the host material comprises a salt that is obtainable by coprecipitation of precursor salts in the presence of the quantum dots.

Further, the wavelength converter element may be used as such. However, the host material enclosing the quantum dots may also be processed (again) into particulate material. This particulate luminescent material may be used in a luminescent application wherein e.g. particles are coated as layer or are embedded, e.g. in a silicone matrix or other dome material of a LED dome, etc. Optionally, the host material may include further luminescent materials which may be based on (other) quantum dots or other type of luminescent materials, like oxide or nitride based luminescent materials.

As indicated above, the luminescent material obtainable with the herein described method may be used as such, such as a particulate material, or in a liquid (dispersion or colloid) or in a wavelength converter element. It especially appears that the thus obtained quantum dots have a silica coating wherein the third elements and/or fourth elements can be traceable. They may be embedded as cation or anion, respectively. Especially, the one or more of a third element (M3) comprising ion and a fourth element (A4) comprising ion are available in the coating in an amount of at least 50 ppm, such as at least 100 ppm, especially at least 200 ppm, respectively. For instance, when $ZnCl_2$ is applied, e.g. 10 ppm of Zn may be found in the coating (and optionally also Cl). Likewise, when $Na_2S$ is applied, e.g. 100 ppm of S may be found (and e.g. also 10 ppm of Na) in the coating. Here ppm especially refers to atoms of the indicated specie(s) relative to the total number of atoms of the coating (i.e. especially Si and O in the case of a silica coating). Hence, the term "ppm" especially refers to "atom ppm". In a specific embodiment, a luminescent material is provided wherein the one or more of a third element M3 and a fourth element A4 are available in the coating in a weight ratio to silicon in the range of 1:100-25:100, respectively, such as 2:100-25:100, respectively. Hence, the coating may e.g. comprise Zn in such a weight percentage, that a Zn:Si weight ratio in the range of 1:100-25:100 is provided. Likewise, the coating may e.g. comprise S in such a weight percentage, that a S:Si weight ratio in the range of 1:100-25:100 is provided. In a specific embodiment, the third element M3 is available in the coating in a weight ratio to silicon in the range of 1:100-25:100 and the fourth element A4 is available in the coating in a weight ratio to silicon in the range of 1:100-25:100. When M3 and/or A4 comprise a combination of elements, such as e.g. in an embodiment Zn and Cd and/or in another embodiment Se and S, respectively, the weight ratio range may especially apply the weight of the combination of elements. The coating thus comprises silica, and in addition the coating comprises one or more of M3 and A4, especially M3 in the form of a M3 oxide and A3 in the form of a sodium or other alkaline earth A4 species. M3 and/or A4 may be embedded in the silica, or may be at an interface of the outer layer of the quantum dot, or may at an outer layer of the silica layer. Also combinations may be possible. The distribution of M3 and/or A4 over the silica comprising layer may also depend when and how M3 and/or A4 are applied during the synthesis process.

When the third element and/or fourth element are applied after the coating process has commenced, or especially after the coating process substantially terminated, there may be a concentration gradient of the third element and/or fourth element, respectively, with a higher concentration more remote from the QD and a lower concentration closer to the QD.

Amongst others, the cations and/or anions may be detected with TEM, EDX, or total reflection x-ray fluorescence in conjunction with synchrotron radiation (SR-TXRF). Further, by etching or dissolving thin layers, one may perform elemental analysis on the etched or dissolved material such as by ICP-MS. Especially when one or more of M3≠M1 and A4≠A2 applies, detection of the presence of an element that has been used during and/or after the coating process may be easy, as this may be an element that does not naturally belong to the outer coating and neither naturally belong to the (silica) coating.

The (final) (silica comprising) coating may e.g. have a thickness in the range of 1-50 nm, such as 2-20 nm. Further, the herein described (silica) coating process, which is executed in the presence of the third element and/or fourth element and/or which is followed by a treatment or impregnation with the third element and/or fourth element, may optionally be subjected to a further coating process and/or embodiment in a host material (see further herein).

The luminescent material may in an embodiment comprise a liquid comprising said silica coated quantum dots, optionally with capping agent coordinating to the quantum dots. This luminescent material may be a dispersion or colloid or gel. Applications of such luminescent material may include lighting application wherein the luminescent material is enclosed in a vessel or cuvette like body or another envelope. However, the luminescent material when dissolved in an aqueous liquid may also be used for biological applications, including medical applications, for instance as biomarkers. Other options include photovoltaic applications or photodiode applications.

In yet another embodiment, the luminescent material substantially comprises the QDs. For instance, the QDs may be separated from the liquid with techniques known in the art, including evaporation of the liquid, etc., thereby providing the QDs agents as powder or cake. Subsequently, the thus obtained material may be further processed (see also below) into e.g. particulate material. For instance, the luminescent material may also be provided as coating on a substrate. The luminescent material substantially comprising the QDs may also be encapsulated in a matrix, such as an inorganic or organic matrix, to provide e.g. a wavelength converter element.

The quantum dots or luminescent nanoparticles, which are herein indicated as wavelength converter nanoparticles, may for instance comprise group II-VI compound semiconductor quantum dots selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe. In another embodiment, the luminescent nanoparticles may for instance be group III-V compound semiconductor quantum dots selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. In yet a further embodiment, the luminescent nanoparticles may for instance be I-III-VI2 chalcopyrite-type semiconductor quantum dots selected from the group consisting of $CuInS_2$, $CuInSe_2$, $CuGaS_2$, $CuGaSe_2$, $AgInS_2$, $AgInSe_2$, $AgGaS_2$, and $AgGaSe_2$. In yet a further embodiment, the luminescent nanoparticles may for instance be I-V-VI2 semiconductor quantum dots, such as selected from the group consisting of $LiAsSe_2$, $NaAsSe_2$ and $KAsSe_2$. In yet a further embodiment, the luminescent nanoparticles may for instance be a group IV-VI compound semiconductor nano crystals such as SbTe. In a specific embodiment, the luminescent nanoparticles are selected from the group consisting of InP, $CuInS_2$, $CuInSe_2$, CdTe, CdSe, CdSeTe, $AgInS_2$ and $AgInSe_2$. In yet a further embodiment, the luminescent nanoparticles may for instance be one of the group II-VI, III-V, I-III-V and IV-VI compound semiconductor nano crystals selected from the materials described above with inside dopants such as ZnSe:Mn, ZnS:Mn. The dopant elements could be selected from Mn, Ag, Zn, Eu, S, P, Cu, Ce, Tb, Au, Pb, Tb, Sb, Sn and Tl. Herein, the luminescent nanoparticles based luminescent material may also comprise different types of QDs, such as CdSe and ZnSe:Mn.

It appears to be especially advantageous to use II-VI quantum dots. Hence, in an embodiment the semiconductor based luminescent quantum dots comprise II-VI quantum dots, especially selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe, even more especially selected from the group consisting of CdS, CdSe, CdSe/CdS and CdSe/CdS/ZnS. In an embodiment, however, Cd-free QDs are applied. In a specific embodiment, the wavelength converter nano-particles comprise III-V QDs, more specifically an InP based quantum dots, such as a core-shell InP—ZnS QDs. Note that the terms "InP quantum dot" or "InP based quantum dot" and similar terms may relate to "bare" InP QDs, but also to core-shell InP QDs, with a shell on the InP core, such as a core-shell InP—ZnS QDs, like a InP—ZnS QDs dot-in-rod.

Hence, more in general M1 and M3 are each independently selected from the group consisting of Zn, Cd, and Hg, and A2 and A4 are each independently selected from the group consisting of S, Se and Te, more especially independently selected from the group consisting of S and Se. This may especially be relevant for II-VI based quantum dots, or for core-shell type quantum dots comprising an outer layer comprising such II-VI material.

Alternatively or additionally, M1 and M3 are each independently selected from the group consisting of Ga, Al and In, and A2 and A4 are each independently selected from the group consisting of P, N and As. This may especially be relevant for III-V based quantum dots, or for core-shell type quantum dots comprising an outer layer comprising such III-V material.

Alternatively or additionally, M1 and M3 are each independently selected from the group consisting of Cu, Ga, Ag and In, and A2 and A4 are each independently selected from the group consisting of S, Se and Te, more especially independently selected from the group consisting of S and Se. This may especially be relevant for I-III-VI2 based quantum dots, or for core-shell type quantum dots comprising an outer layer comprising such I-III-VI2 material.

Alternatively or additionally, M1 and M3 are each independently selected from the group consisting of Li, Na, and K, in combination with As, and A2 and A4 are each independently selected from the group consisting of S, Se and Te, more especially independently selected from the group consisting of S and Se, even more especially Se. This may especially be relevant for I-V-VI2 based quantum dots, or for core-shell type quantum dots comprising an outer layer comprising such I-V-VI2 material.

The luminescent nanoparticles (without coating) may have dimensions in the range of about 1-50 nm, especially 1-20 nm, such as 1-15 nm, like 1-5 nm; especially at least 90% of the nanoparticles have dimension in the indicated ranges, respectively, (i.e. e.g. at least 90% of the nanoparticles have dimensions in the range of 2-50 nm, or especially at least 90% of the nanoparticles have dimensions in the range of 5-15 nm). The term "dimensions" especially relate to one or more of length, width, and diameter, dependent upon the shape of the nanoparticle. In an embodiments, the wavelength converter nanoparticles have an average particle size in a range from about 1 to about 1000 nanometers (nm), and preferably in a range from about 1 to about 100 nm. In an embodiment, nanoparticles have an average particle size in a range from about 1-50 nm, especially 1 to about 20 nm, and in general at least 1.5 nm, such as at least 2 nm. In an embodiment, nanoparticles have an average particle size in a range from about 1 to about 20 nm.

Typical dots may be made of binary alloys such as cadmium selenide, cadmium sulfide, indium arsenide, and indium phosphide. However, dots may also be made from ternary alloys such as cadmium selenide sulfide. These quantum dots can contain as few as 100 to 100,000 atoms within the quantum dot volume, with a diameter of 10 to 50 atoms. This corresponds to about 2 to 10 nanometers. For instance, (spherical) particles such as CdSe, InP, or $CuInSe_2$, with a diameter of about 3 nm may be provided. The luminescent nanoparticles (without coating) may have the shape of spherical, cube, rods, wires, disk, multi-pods, etc., with the size in one dimension of less than 10 nm. For instance, nanorods of CdSe with the length of 20 nm and a diameter of 4 nm may be provided. Hence, in an embodiment the semiconductor based luminescent quantum dots comprise core-shell quantum dots. In yet another embodiment, the semiconductor based luminescent quantum dots comprise dots-in-rods nanoparticles. A combination of different types of particles may also be applied. For instance, core-shell particles and dots-in-rods may be applied and/or combinations of two or more of the afore-mentioned nano particles may be applied, such as CdS and CdSe. Here, the term "different types" may relate to different geometries as well as to different types of semiconductor luminescent material. Hence, a combination of two or more of (the above indicated) quantum dots or luminescent nano-particles may also be applied. Hence, in an embodiment the quantum dots have a shape selected from the group consisting of a sphere, a cube, a rod, a wire, a disk, and a multi-pod, etc. A combination of different types of particles may also be applied. Here, the term "different types" may relate to different geometries as well as to different types of semiconductor luminescent material. Hence, a combination of two or more of (the above indicated) quantum dots or luminescent nano-particles may also be applied.

In an embodiment, nanoparticles or QDs can comprise semiconductor nanocrystals including a core comprising a first semiconductor material and a shell comprising a second semiconductor material, wherein the shell is disposed over at least a portion of a surface of the core. A semiconductor nanocrystal or QD including a core and shell is also referred to as a "core/shell" semiconductor nanocrystal.

For example, the semiconductor nanocrystal or QD can include a core having the formula MX, where M can be cadmium, zinc, magnesium, mercury, aluminum, gallium, indium, thallium, or mixtures thereof, and X can be oxygen, sulfur, selenium, tellurium, nitrogen, phosphorus, arsenic, antimony, or mixtures thereof. Examples of materials suitable for use as semiconductor nanocrystal cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

The shell can be a semiconductor material having a composition that is the same as or different from the composition of the core. The shell comprises an overcoat of a semiconductor material on a surface of the core semiconductor nanocrystal can include a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating may comprise one or more layers. The overcoating comprises at least one semiconductor material which is the same as or different from the composition of the core. Preferably, the overcoating has a thickness from about one to about ten monolayers. An overcoating can also have a thickness greater than ten monolayers. In an embodiment, more than one overcoating can be included on a core.

In an embodiment, the surrounding "shell" material can have a band gap greater than the band gap of the core material. In certain other embodiments, the surrounding shell material can have a band gap less than the band gap of the core material. In an embodiment, the shell can be chosen so as to have an atomic spacing close to that of the "core" substrate. In certain other embodiments, the shell and core materials can have the same crystal structure. Examples of semiconductor nanocrystal (core)shell materials include, without limitation: red (e.g., (CdSe)ZnS (core)shell), green (e.g., (CdZnSe)CdZnS (core)shell, etc.), and blue (e.g., (CdS)CdZnS (core)shell (see further also above for examples of specific wavelength converter nanoparticles, based on semiconductors. Herein, the terms "semiconductor nanocrystal" and "QD" are used interchangeably.

Hence, the above-mentioned outer surface may be the surface of a bare quantum dot (i.e. a QD not comprising a further shell or coating) or may be the surface of a coated quantum dot, such as a core-shell quantum dot (like core-shell or dot-in-rod), i.e. the (outer) surface of the shell. The grafting ligand thus especially grafts to the outer surface of the quantum dot, such as the outer surface of a dot-in-rod QD.

Therefore, in a specific embodiment, the wavelength converter nanoparticles are selected from the group consisting of core-shell nano particles, with the cores and shells comprising one or more of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. In general, the cores and shells comprise the same class of material, but essentially consist of different materials, like a ZnS shell surrounding a CdSe core, etc.

The term wavelength converter refers to a system that is configured to convert light from a first wavelength into light of a second wavelength. Especially, UV and/or blue light (excitation wavelength) may be (at least partially) converted into (visible) light of higher wavelength than the excitation wavelength. This will further be elucidated below.

The wavelength converter element may e.g. be (configured as) a layer, such as a film, especially a polymeric layer, or a body, such as a dome. Alternatively or additionally, the wavelength converter may also be (configured as) a lens or reflector.

Hence, especially the first element (M1) and the third element (M3) are (independently) selected from the group of metals, such as especially selected from the group of Cd, Zn, Hg, Ga, In Al, Tl, Pb, Cu, Ge, Sn, V, especially from the group consisting of Cd, Zn, Hg, Ga, In, and Al. Especially, the first element (M1) comprising ion comprises a cation, and is especially selected from the cations of the elements selected from the group consisting of Cd, Zn, Hg, Ga, In, Al, Tl, Pb, Cu especially from the group consisting of Cd, Zn, Hg, Ga, In, and Al.

Further, especially the second element (A2) and the fourth element (A4) are (independently) selected from the group of non-metals, such as especially selected from the group consisting of S, Se, Te, N, P, Sb, and As, especially from the group consisting of S, Se, Te, N, and P, such as S and/or Se. Especially the second element (A1) comprising ion comprises an anion, and is especially selected from anions of the elements selected from the group consisting of S, Se, Te, N, P, and As.

The outer layer may especially be a compound essentially based on M1 and A2, such as a semiconductor outer layer like ZnS, where M1=Zn and A2=S.

Note that in e.g. systems like HgSeTe A2 may refer to a combination of two elements. Hence, M1, A2, M3, and A4 independently may include one or more of the herein indicated elements for these categories.

In yet a further specific embodiment, the first element (M1) and the third element (M3) do not belong to the same group of the periodic system and/or the second element (A2) and the fourth element (A4) belong to the same group of the periodic system. For instance, in an embodiment the outer layer may comprise ZnS and the fourth element comprises P.

In yet a further aspect of the invention, it appears that especially $SO_4^{2-}$ and/or $PO_4^{3-}$, substantially irrespective of the outer layer, may have a QE increasing and/or stabilizing effect (on the life time). Hence, in yet a further embodiment the invention also provides method for the production of a luminescent material based on coated quantum dots, the method comprising: (i) providing luminescent quantum dots in a liquid medium wherein the luminescent quantum dots have an outer layer; and (ii) providing in a coating process a coating on the outer layer of the quantum dots in the liquid medium, wherein the coating comprises a silica coating; wherein during the coating process, or after the coating process, or during and after the coating process, the liquid medium comprises one or more of $SO_4^{2-}$ and $PO_4^{3-}$. Other ions that may be applied may e.g. include one or more of the aluminate ion ($Al(OH)_4^-$), the stannate ion ($SnO_3^-$, $SnO_3^{2-}$, and $SnO_4^{4-}$), the vanadate ion ($VO_3^-$, $VO_4^{3-}$), the molybdate ion ($MoO_4^{2-}$), the tungstate ion ($WO_4^2$) and the zincate ion ($Zn(OH)_4^{2-}$), and other complex metal ions. These may also be used in combination of ions wherein a corresponding element is used (i.e. an element corresponding with the elements in the outer layer). Further, the invention also relates to the luminescent material obtainable with such method(s) (see also the other herein described embodiments).

In yet a further aspect, the invention also provides a lighting device comprising a light source and a luminescent material, as defined herein, or obtainable by the method as defined herein, wherein the light source is configured to illuminate the luminescent material. The luminescent material, as such, or embedded in the host material, may be used to convert light source light into luminescent material light (or converter light). The luminescent material, such as embedded in the host material, may be radiationally coupled to the light source. The term "radiationally coupled" especially means that the light source and the luminescent material are associated with each other so that at least part of the radiation emitted by the light source is received by the luminescent material (and at least partly converted into luminescence (luminescence material light)).

The device is especially configured to generate device light, which at least partly comprises the converter light, but which may optionally also comprise (remaining) light source light. For instance, the wavelength converter may be configured to only partly convert the light source light. In such instance, the device light may comprise converter light and light source light. However, in another embodiment the wavelength converter may also be configured to convert all the light source light.

Hence, in a specific embodiment, the lighting device is configured to provide lighting device light comprising both light source light and converter light, for instance the former being blue light, and the latter comprising yellow light, or yellow and red light, or green and red light, or green, yellow and red light, etc. In yet another specific embodiment, the lighting device is configured to provide only lighting device light comprising only converter light. This may for instance happen (especially in transmissive mode) when light source light irradiating the wavelength converter only leaves the downstream side of the wavelength converter as converted light (i.e. all light source light penetrating into the wavelength converter is absorbed by the wavelength converter).

The term "wavelength converter" may also relate to a plurality of wavelength converters. These can be arranged downstream of one another, but may also be arranged adjacent to each other (optionally also even in physical contact as directly neighboring wavelength converters). The plurality of wavelength converters may comprise in an embodiment two or more subsets which have different optical properties. For instance, one or more subsets may be configured to generate wavelength converter light with a first spectral light distribution, like green light, and one or more subsets may be configured to generate wavelength converter light with a second spectral light distribution, like red light. More than two or more subsets may be applied. When applying different subsets having different optical properties, e.g. white light may be provided and/or the color of the device light (i.e. the converter light and optional remaining light source light (remaining downstream of the wavelength converter). Especially when a plurality of light sources is applied, of which two or more subsets may be individually controlled, which are radiationally coupled with the two or more wavelength converter subsets with different optical properties, the color of the device light may be tunable. Other options to make white light are also possible (see also below).

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD back-lighting.

As indicated above, the lighting unit may be used as backlighting unit in an LCD display device. Hence, the invention provides also a LCD display device comprising the lighting unit as defined herein, configured as backlighting unit. The invention also provides in a further aspect a liquid crystal display device comprising a back lighting unit, wherein the back lighting unit comprises one or more lighting devices as defined herein.

Preferably, the light source is a light source that during operation emits (light source light) at least light at a wavelength selected from the range of 200-490 nm, especially a light source that during operation emits at least light at wavelength selected from the range of 400-490 nm, even more especially in the range of 440-490 nm. This light may partially be used by the wavelength converter nanoparticles (see further also below). Hence, in a specific embodiment, the light source is configured to generate blue light.

In a specific embodiment, the light source comprises a solid state LED light source (such as a LED or laser diode).

In yet a further aspect of the invention, a lamp comprises at least one lighting device according to the invention.

In yet a further aspect of the invention, a luminaire comprises at least one lighting device according to the invention or at least one lamp according to the invention.

The term "light source" may also relate to a plurality of light sources, such as 2-20 (solid state) LED light sources. Hence, the term LED may also refer to a plurality of LEDs.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises"

means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 1b schematically depicts a quantum dot based luminescent material;

FIG. 1c schematically depicts an embodiment of the luminescent material;

The schematic drawings amongst the above figures are not necessarily on scale.

Figure 9A:
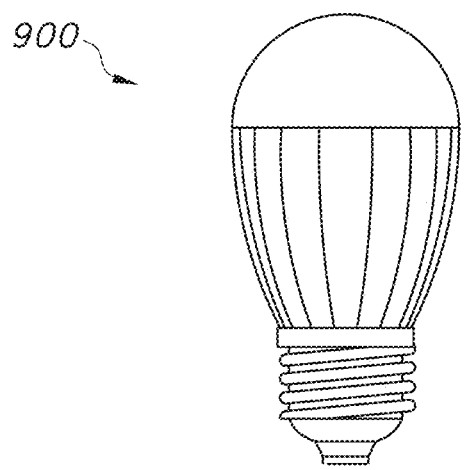
Figure 9B:
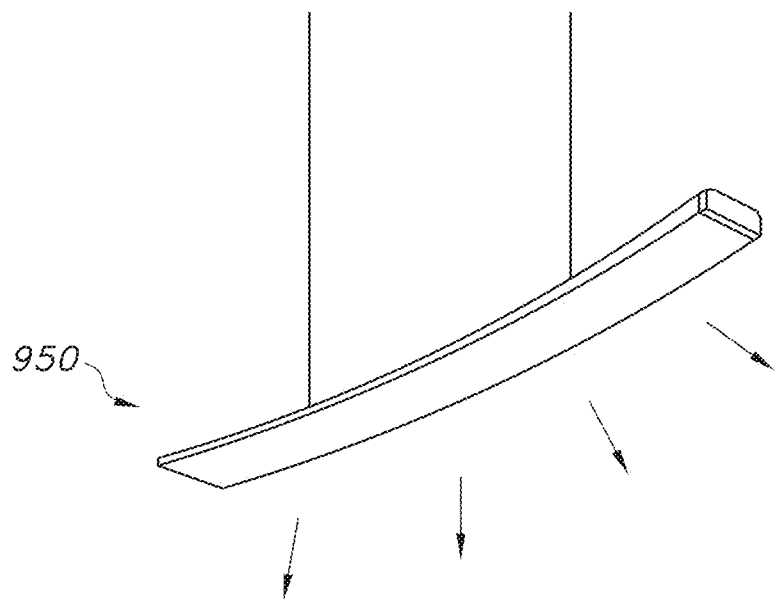

FIG. 9a shows a lamp according to the invention and FIG. 9b shows a luminaire according to the invention.

Figure 10A:
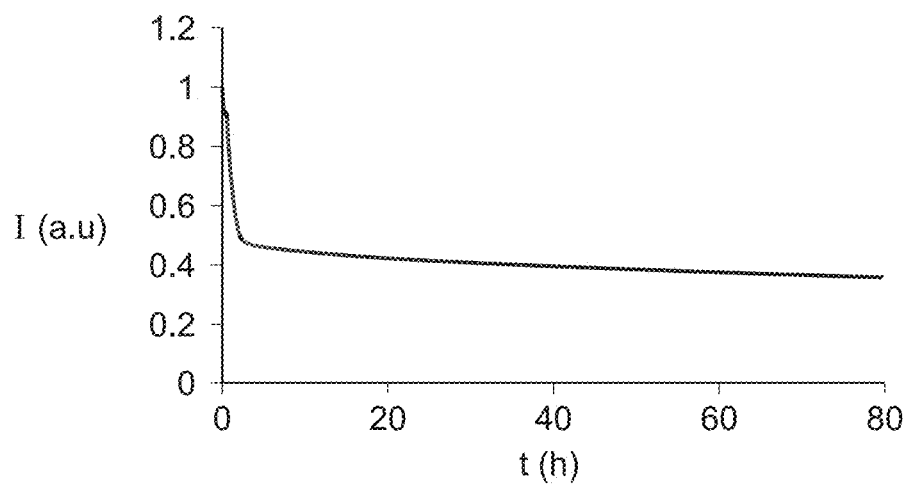
Figure 10B:
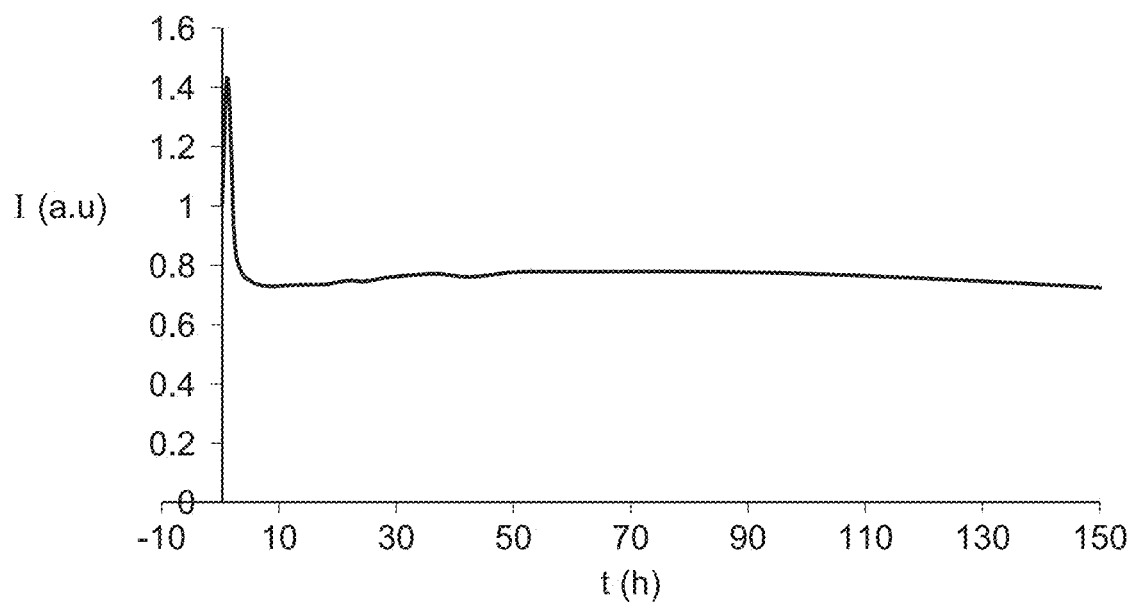

FIGS. 10a-10b show stability measurements of Examples 8-9, respectively, with on the x-axis the time in hours and on the y-axis the emission intensity in arbitrary units (a.u.).

DETAILED DESCRIPTION OF THE EMBODIMENTS AND EXAMPLES

Figure 1A:
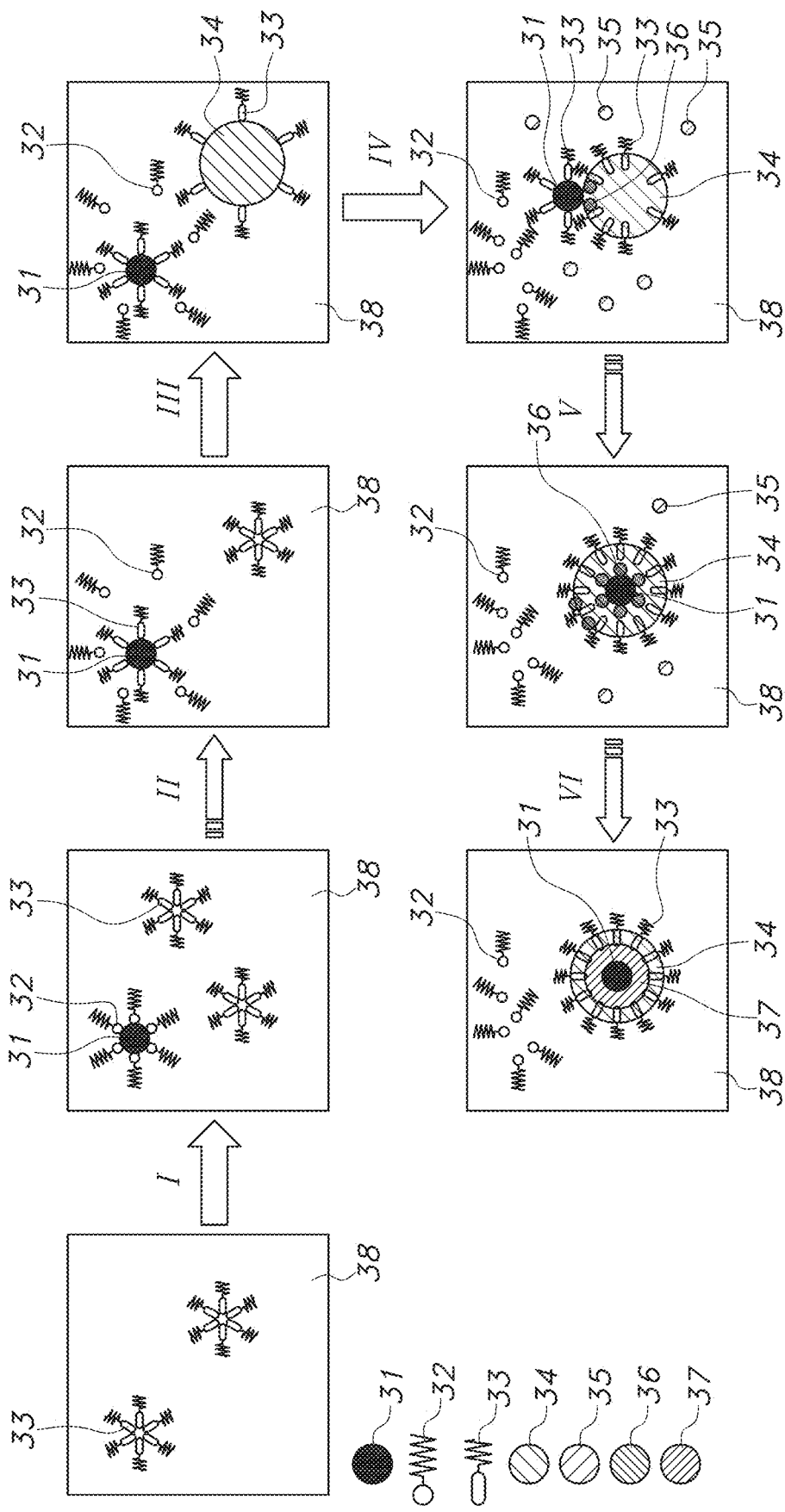
FIG. 1a schematically depicts an embodiment of the reverse micelle method (copied from H. Ding, Y. Zhang, S. Wang, J. Xu, S. Xu and G. Li, "$Fe_3O_4@SiO_2$ Core/Shell Nanoparticles: The Silica Coating Regulations with a Single Core for Different Core Sizes and Shell Thicknesses," Chem. Mater., vol. 24, p. 4572-4580, 2012)

FIG. 1a schematically depicts an embodiment of the reverse micelle method. Reference 31 indicates a QD, reference 32 indicates a ligand, such as oleic acid or hexadecylamine; reference 33 indicates a surfactant, such as Igepal CO-520, reference 34 indicates a silica formation catalyst such as ammonia, reference 35 indicates a silica precursor, such as TEOS, reference 36 indicates a hydrolyzed silica precursor, such as hydrolyzed TEOS, reference 37 indicates silica and reference 38 indicates a liquid medium, especially an organic apolar solvent, such as cyclohexane.

In FIG. 1a, a schematic overview of most of stages in the reverse micelle method is shown. First the apolar solvent, such as cyclo hexane, and the surfactant Igepal® CO-520 are mixed. Then the quantum dots, typically with oleic acid as ligands are added, which results in a ligand exchange with Igepal® CO-520, which can be shown by nuclear magnetic resonance. After the addition of the quantum dots, ammonia (25% in water) is added which is the catalyst for silica formation (other catalyst can be e.g. dimethylamine), in which the higher the concentration the faster the silica growth takes place. At the moment of the addition of ammonia, micelles will form, in which ammonia is the inner volume of the micelles and Igepal® CO-520 is the surfactant. Water (such as from ammonia) may also necessary for the hydrolysis reaction of the silica (with ethanol as reaction product), although it gets released again at the condensation reaction. In the following step (ammonia addition and TEOS addition can also be reversed) TEOS is added.

This silica precursor gets hydrolyzed (partly), due to the ammonia and a ligand exchange will take place with the Igepal and/or native ligands on the quantum dot surface. This will also make the quantum dots water soluble and enables the QDs to be present within the hydrophilic cores of the micelles. Micelles are very dynamic which interchange rapidly, however the amount of quantum dots added should roughly match the typical amount of silica spheres would be produced in the same synthesis procedure without QD addition. In this way it is possible to get exactly one quantum dot per micelle. The fact that the QDs are in the middle of the silica spheres indicates that the QDs act as seeds for silica growth. After the ligand exchange by TEOS, the silica will grow with a speed depending on the ammonia concentration. After several days all TEOS molecules condensate and the growth stop.

In another example one can use QDs that have charged ligands (such as MPA, mercaptopropionic acid) which allows dispersion of these QDs in water. For these QDs with charged ligands dispersed in water it was stated that due to the charge of the quantum dot, it pushed other quantum dots out of the micelle. This electrostatic repulsion in combination with the correct match of the amount of quantum dots and silica particles would yield a good precision of one quantum dot per silica shell.

In this way, the silica coated QDs can be obtained. After the last stage, the silica coated QDs can, when desired, be retrieved from the liquid medium. An option is to add a precipitator, i.e. a material that induces flocculation and subsequent precipitation of the QDs. For instance, ethanol can be used. Thereafter, the QDs can be washed, with a second liquid medium, such as ethanol or another (organic) (polar) solvent (such as one or more of acetonitrile, isopropanol, acetone, etc.). Within ethanol, the QDs can be dispersed and stored. Alternatively, the QDs can be retrieved from the second liquid medium (see also above) and can be embedded in a host material (see also below).

Further, after the silica growth also one or more post treatments may be applied. Optionally, a further salt treatment stage may be included. Further, the quantum dots may be subject to a thermal treatment, which may lead to a more stable QE.

FIG. 1b schematically depicts a quantum dot based luminescent material 10. By way of example different types of QDs, indicated with reference 100, are depicted. The QD at the top left is a bare QD, without shell. The QD is indicated with C (core). The QD 10 at the right top is a core-shell particle, with C again indicating the core, and S indicating the shell. At the bottom, another example of a core-shell QD is schematically depicted, but a quantum dot in rod is used as example. Reference 105 indicates the outer layer, which is in the first example the core material at the external surface, and which is in the latter two embodiments the shell material at the external surface of the QD 100.

FIG. 1c schematically depicts an embodiment of the luminescent material 10, but now the QDs 100 including the coating 120, especially an oxide coating, such as a silica coating. The thickness of the coating is indicated with reference d1. The thickness may especially be in the range of 1-50 nm. Especially, the coating 120 is available over the entire outer layer 105. Note however that a silica coating may be somewhat permeable. Note also that the outer layer 105 of the uncoated nanoparticle (i.e. not yet coated with the coating of the invention), is (in general) not an outer layer anymore after the coating process, as then an outer layer will be the outer layer of the coating 120. However, herein the term outer layer, especially indicated with reference 105, refers to the outer layer of the uncoated (core-shell) nanoparticle.

Below, some examples are described in more detail.

A typical QD-silica shell growth is performed by mixing 10 ml cyclohexane and 1.276 ml igepal co-520 in a 20 mL vial under vigorous stirring. 80 µl TEOS, 1 ml cyclohexane and 12 µl QDs in heptane (50 mg/ml, CdS core ZnS shell Crystal plex dots commercially obtained via Crystalplex Inc.) are mixed for around 7 minutes and are afterwards added to the cyclohexane/igepal mixture. After 15 minutes stirring, 150 µl ammonia (25%) is added which initiates the reaction. This mixture was stirred vigorously for one minute to distribute the ammonia evenly over the formed micelles. 1 minute after the ammonia addition, stirring was stopped and the cup was stored in the dark for typically 2 days. The quantum dots used are of the core shell type, with the core being Cd(Se,S) and the shell being ZnS. These quantum dots can be used for both red and green, with the latter having smaller dimensions. These quantum dots are provided with alkyl ligands (especially oleic acid) and in solvent, such as hexane.

To stop the silica growth, 2.5 ml ethanol was added after which the QD with silica coating will precipitate and can be collected by centrifugation. The precipitation was dissolved in 9 ml ethanol and centrifuged again to wash the sample and remove unwanted reagents. This was repeated for two more times. Finally the sample was stored in ethanol and sonication was used disperse the QD with silica coating until a clear solution was obtained.

Figures 4A, 4B:
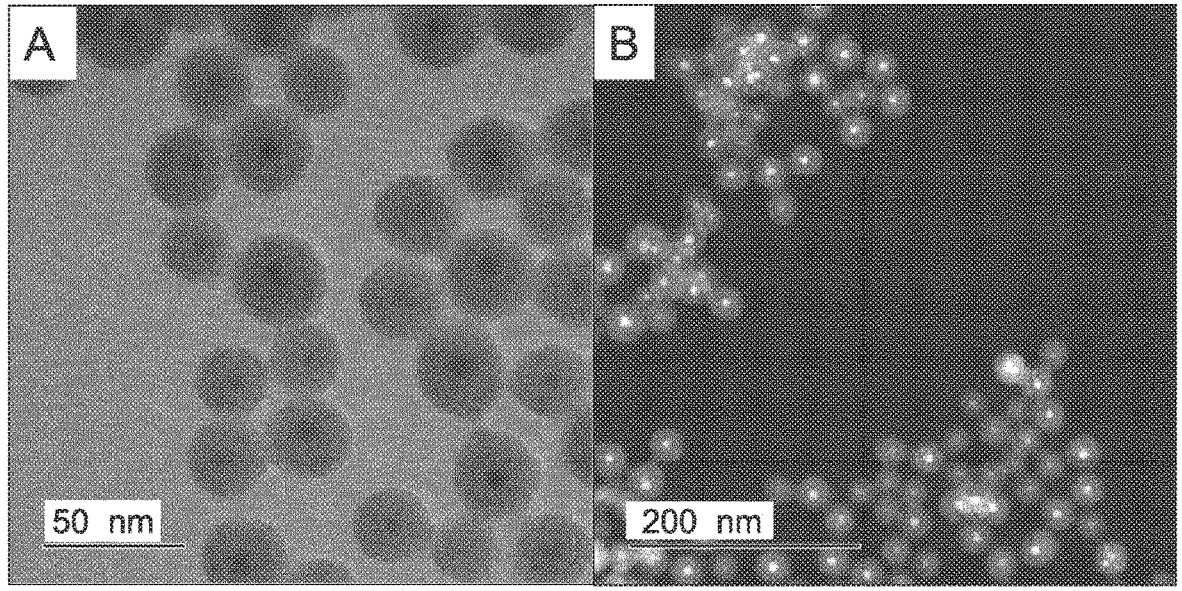
FIG. 4 shows (A-C) TEM images of QDs incorporated in silica without addition of salts (4A), and where $ZnCl_2$ was added to ammonia upfront (4B) a HAADF-TEM image is shown which more clearly shows the QDs, but also other small particles inside the shell. In (4C) a zoomed image is shown with red arrows indicating the very small (~2-3 nm) particles (likely $ZnCl_2$ or $ZnO_2$) in the silica shell. (4D) shows a TEM image of silica particles where $Na_2S$ was added to the ammonia upfront. The image shows that the QDs are substantially not incorporated in this case.

Silica growth takes place in the (basic) aqueous phase within the reverse micelle, and QDs can act as seeds for shell growth. Therefore, at the appropriate ratio of QDs and micelles it is possible to incorporate single QDs in the middle of individual silica particles of roughly 20-25 nm in diameter, see FIG. 4a. It appears that the QDs with a hydrophobic oleic acid capping, which disperse well in apolar solvents like toluene or heptanes, act as seeds in the aqueous phase of the reverse micelle. It seems that hydrolyzed TEOS molecules (i.e. Si—O$^-$ groups) can replace the oleic acid molecule (the native ligand). The TEOS-capped QDs have a much better affinity for the polar aqueous phase, and can therefore act as seed of silica growth.

In the examples below, it is shown that the QE of QDs typically drops from 80% to 20-30% upon silica shell growth using the standard recipe. However, the QE can be improved to 50% if salts such as $ZnCl_2$ or $Na_2S$ are added during or after silica shell growth. The light exposure effect (sometimes also called "photobrightening effect) and peak wavelengths are also affected depending on the exact addition procedure and material. The results clearly show that the added salts have an effect on the QD performance. Eventually, a QE of above 70% could be measured (in air) using the modified silica shell growth procedure and applying a light exposure step.

Example 1: QE of Baseline QD-silica Samples

As a baseline, first a silica shell was grown around QDs using the standard recipe as described above. Aliquots were taken during silica shell growth, and the QE and peak wavelength were measured. Table 1 gives an overview of the QE as function of time. It shows that the QE drops from 80% of the native dots, towards 20-30% after silica shell growth. The drop predominantly takes place within the first 5 minutes of silica shell growth, which confirms that this is due to a QD surface/ligand effect. The resulting silica coated QDs using this recipe are shown in FIG. 1.

TABLE 1 evolution of the quantum efficiency and peak position during silica shell growth.

| Time after quenching [min] | Quantum efficiency [%] | Peak position [nm] |
|---|---|---|
| Original dots 2.5 mg/ml | 80.2 | 609.73 |
| 5 | 39.7 | 608.73 |
| 150 | 26.2 | 607.06 |
| 600 | 29.8 | 605.10 |
| 1147 | 29.7 | 604.47 |
| 2880 | 31.9 | 604.18 |
| 10080 | 19.2 | 604.09 |

Figure 2:
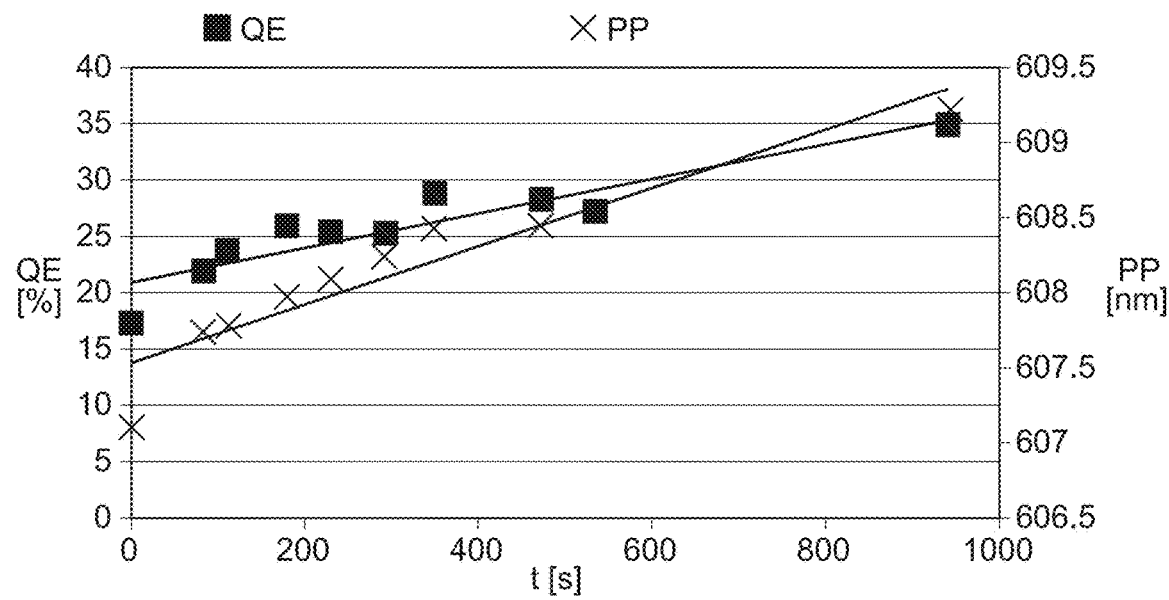
FIG. 2 evolution of QE (squares) and emission peak wavelength (crosses) over time (t in seconds) upon exposure of blue light of a standard silica coated QD sample, without any salt addition; "PP" indicates peak position (in wavelength (nm))
Figure 3:
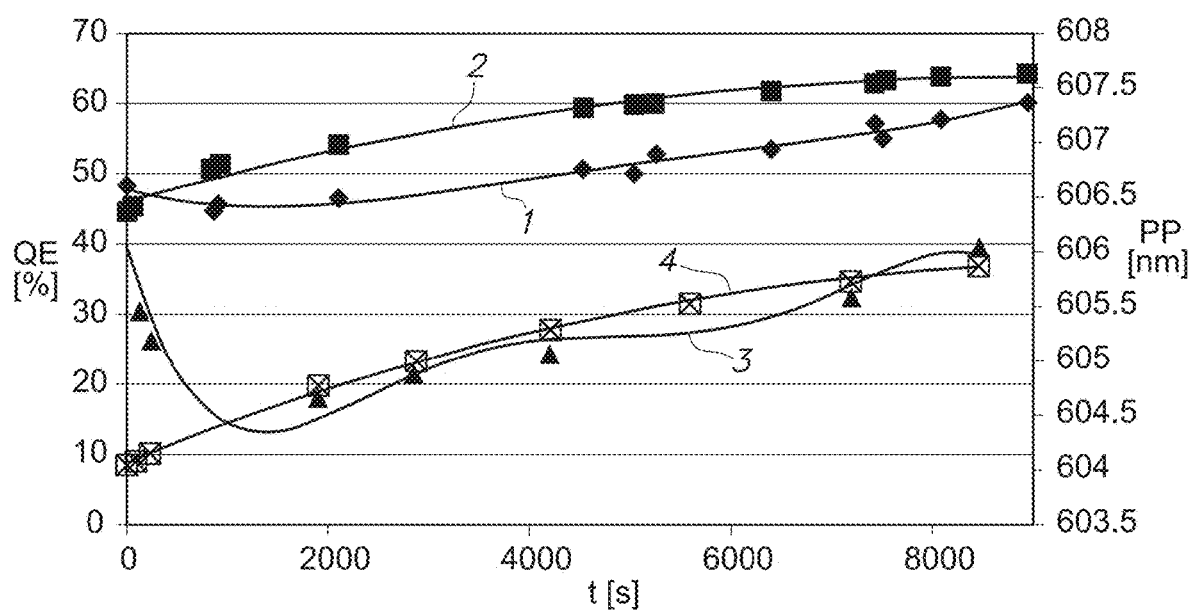
FIG. 3 evolution of QE (upper curves) and emission peak wavelength (lower curves) over time (t in seconds) upon exposure of blue light of silica coated QDs where either $ZnCl_2$ (diamond (1); upper squares (2)) or $Na_2S$ (triangles (3); lower squares (4)) was added after the silica growth but before the washing procedure.

FIG. 2 shows how the QE of liquid samples of a typical "baseline" silica coated QD sample changes upon exposure of blue light. Moderate light exposure is observed, with a final QE up to 35%. The light exposure is typically accompanied by a red-shift in emission wavelength.

The standard light exposure herein is executed by exposure to (blue) light at medium flux (~1 W/cm$^2$). In this way, the light exposure effect or photobrightening effect may be evaluated as sometimes the QE increases (photobrightening), or sometimes also decreases, under light exposure.

Example 2: Addition of $ZnCl_2$ or $Na_2S$ after Silica Growth but before the Washing Procedure To investigate the influence of salts on the QE of QDs, $ZnCl_2$ or $Na_2S$ were added after the silica shell growth was completed (after 20 hours of shell growth in the dark). For these experiments a silica shell growth experiment was performed as described in Example 1, but after 20 hours of shell growth the mixture was divided over several vials for multiple addition experiments on the same baseline QD-silica mixture. For both salts, 100 µl of a certain concentration salt in water was added to the reverse micelle mixture under mild stirring. This was done before the washing procedure was performed, in other words the micelles were still intact. After 1 hour of stirring with the added salt, the mixture was washed using the standard procedure, and the particles were redispersed in Ethanol after which the QE was determined. The QE's are listed in Table 2, together with the peak wavelength of the QD emission spectrum. The reference samples have a QE of 33% and 35%, which is slightly higher than the result described above but within the same range. When $ZnCl_2$ is added, a gradual increase in QE is observed with increasing salt concentration (up to 47%), together with a red-shift in the emission peak wavelength (up to 2 nm). Similarly, an increase in QE to 49% is observed upon addition of a 100 mM $Na_2S$ solution, however 400 mM shows an increase to only 39%. Albeit a small change, the emission peak wavelength shifts to the blue in this case by approximately 0.5-1 nm.

The results above show that addition of a salt has an impact on the final QE and peak wavelength of the QDs. It suggests that the ions have the chance to diffuse through the (porous) silica particle towards the QD surface.

TABLE 2

QE data of silica coated QDs with and without addition of 100 µl of $ZnCl_2$ or $Na_2S$ salt at various concentrations.

| Concentration [mM] | $ZnCl_2$ | | $Na_2S$ | |
|---|---|---|---|---|
| | Quantum efficiency [%] | PL peak [nm] | Quantum efficiency [%] | PL peak [nm] |
| 0 (reference 1) | 35 | 604.8 | 35 | 604.8 |
| 0 (reference 2) | 33 | 604.5 | 33 | 604.5 |
| 25 | 36 | 604.8 | n.m. | n.m. |
| 100 | 39 | 605.3 | 49 | 604.5 |
| 400 | 47 | 606.6 | 38 | 604.0 | n.m. = not measured

The QE of the silica coated QDs where $ZnCl_2$ or $Na_2S$ was added after silica growth but before the washing procedure was also followed over time upon illumination with blue light. In both cases 100 µl of 400 mM salt concentration was added. The QE of both samples start at 47% and 40%, in line with the results listed in table 2. The sample treated with $ZnCl_2$ shows light exposure up to 60% QE, accompanied by a red-shift of ~1 nm. The sample treated with $Na_2S$ first shows a dramatic drop in QE to ~15%, after which it increases to ~40%, again accompanied by a red-shift of in this case ~2 nm. From these results it appears that a $ZnCl_2$ treatment after silica growth is a good route.

Example 3: Addition of $ZnCl_2$ and $Na_2S$ after Silica Growth but before the Washing Procedure Silica coated QDs from reference 1 were also used to add both $ZnCl_2$ and $Na_2S$, in different sequence, see Table 3. The results of the reference and $ZnCl_2$-only and $Na_2S$-only experiments are also given for comparison. When first $ZnCl_2$ is added and then $Na_2S$, a QE of 52% is measured, with a peak wavelength of 604.5 nm. When the salts are added in the reverse sequence, a QE of 41% is measured, with a peak wavelength of 605.2 nm. These results confirm the effect of salt addition on QE and peak wavelength, and show that the sequence in which the salts are added do impact the final optical properties of the QDs. The results show that in case of adding both salts, it is most favorable to add $Na_2S$ as last.

TABLE 3 overview of QE upon addition of $ZnCl_2$ and $Na_2S$ after silica growth but before the washing procedure

| Addition sequence | QE [%] | Peak position [nm] |
|---|---|---|
| Reference 1 | 35 | 604.8 |
| $ZnCl_2$ 100 mM | 39 | 605.3 |
| $Na_2S$ 100 mM | 49 | 604.6 |
| $ZnCl_2$ => $Na_2S$ 100 mM | 52 | 604.5 |
| $Na_2S$ => $ZnCl_2$ 100 mM | 41 | 605.2 |

Example 4: Addition of $ZnCl_2$ or $Na_2S$ during Silica Shell Growth

In another embodiment the $ZnCl_2$ or $Na_2S$ were added during the silica growth, where the 100 mM solutions of theses salts were mixed with the ammonia upfront. In this experiment 13 mg ($0.93*10^{-4}$ mol) of $ZnCl_2$ per 150 µL of 35% ammonia was used. Similarly, 50.76 mg $Na_2S$ was added to 150 µL ammonia 35%. $Na_2S$ is a strong base, so also lower ammonia concentration could be useful. TEM images of the results are displayed in FIG. 4 below, in which (A-C) represents the $ZnCl_2$ addition and (D) the $Na_2S$ addition.

Figures 4C, 4D:
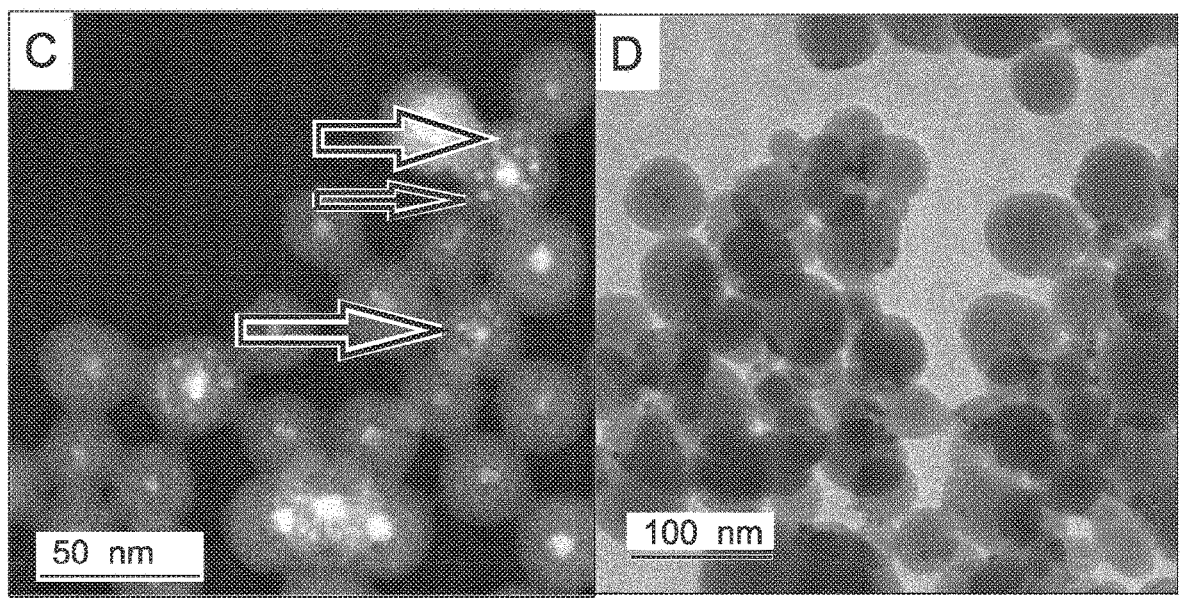

The TEM results in FIG. 4 show that $ZnCl_2$ addition to the ammonia before addition to the silica synthesis results in the formation of small nanoparticles in the shell of the silica particles. These particles could be $ZnCl_2$ and/or ZnO particles, but there is no conclusive evidence for this. The QDs are however still well incorporated in the silica particles. In case $Na_2S$ is added to the ammonia before addition to the silica synthesis, it appears that the QDs are not incorporated into the silica particles, but attached to the outside of the silica particles. It is suggested that this is due to a too high pH during silica growth, because $Na_2S$ is a strong base by itself.

Figure 5:
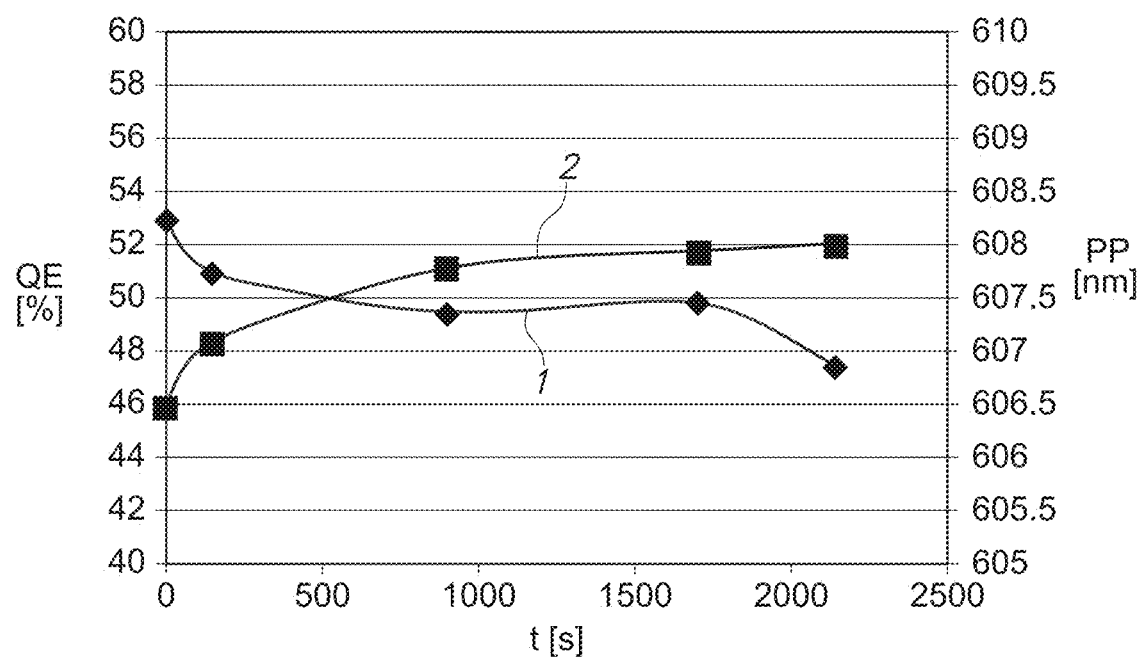
FIG. 5 evolution of QE (diamonds (1)) and emission peak wavelength (squares (2)) over time upon exposure of blue light of silica coated QDs where $ZnCl_2$ was added to the ammonia before silica growth.

The QE of the sample where $ZnCl_2$ was added to the ammonia had a QE of 51% (peak at 606.9 nm) and a remake had a QE of 54% (peak at 606.4 nm). FIG. 5 below shows the that the QE of this sample did not show light exposure (but rather a drop) upon exposure to blue light, accompanied by a red-shift of ~1.5 nm. This is somewhat remarkable because the sample where the $ZnCl_2$ was added to the reaction mixture after silica growth (example 2) did show light exposure effects.

Hence, the invention also provides a luminescent material comprising particles and/or agglomerates of particles, wherein the particles especially have dimensions in the range of 20-500 nm, such as especially 20-350 nm, wherein substantially each particle comprises a (single) quantum dot surrounded by a silica coating. As indicated above, the quantum dot can be of the core-shell type. The silica comprising shell comprises also one or more elements that are shared with the outer layer of the quantum dot. Especially, about at least 70 wt. % of the luminescent material may comprise such particles and/or agglomerates thereof. Hence, the individual particles may not necessarily be interconnected. The individual particles may agglomerate, but may not form a combination of quantum dots sharing a single silica coating. Part of the luminescent material, such as 30 wt. % or less may optionally be based on particles sharing two or more quantum dots.

Figure 6:
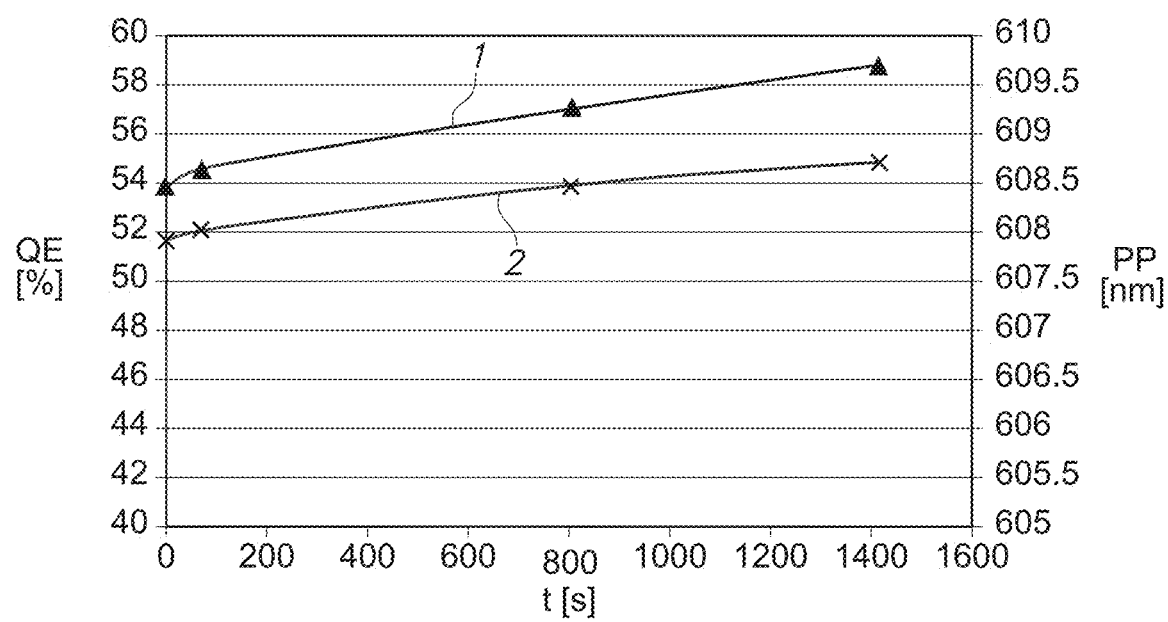
FIG. 6 evolution of QE (triangles (1) and emission peak wavelength (crosses (2) over time upon exposure of blue light of silica coated QDs where $ZnCl_2$ was added to the ammonia before silica growth, and $Na_2S$ was added after silica growth but before the washing procedure.

Example 5: Addition of $ZnCl_2$ during Silica Shell Growth, and $Na_2S$ after Silica Growth but before the Washing Procedure In yet another embodiment, QDs were coated with a silica shell where $ZnCl_2$ was added together with the ammonia, and $Na_2S$ was added after silica growth but before the washing procedure. In this experiment, 13 mg of $ZnCl_2$ was dissolved into the ammonia (35%) solution, of which 150 ul was added at the start of the silica growth. After the silica synthesis was completed (22 hours in the dark without stirring), 100 ul of 400 mM $Na_2S$ in water was added to the reaction mixture and stirred gently for 1 hour. Next, the reaction mixture was precipitated with ethanol and washed 3 times in ethanol. The QE of the resulting sample was 54% at a peak wavelength of 608 nm. FIG. 6 below shows that this sample does show light exposure up to 58% within 1400 s, together with a red-shift in emission peak wavelength of ~0.7 nm. Note that this peak wavelength is clearly different from the sample described in example 4, where $ZnCl_2$ addition without $Na_2S$ post treatment resulted in an initial peak at 606.5 nm.

Figure 7:
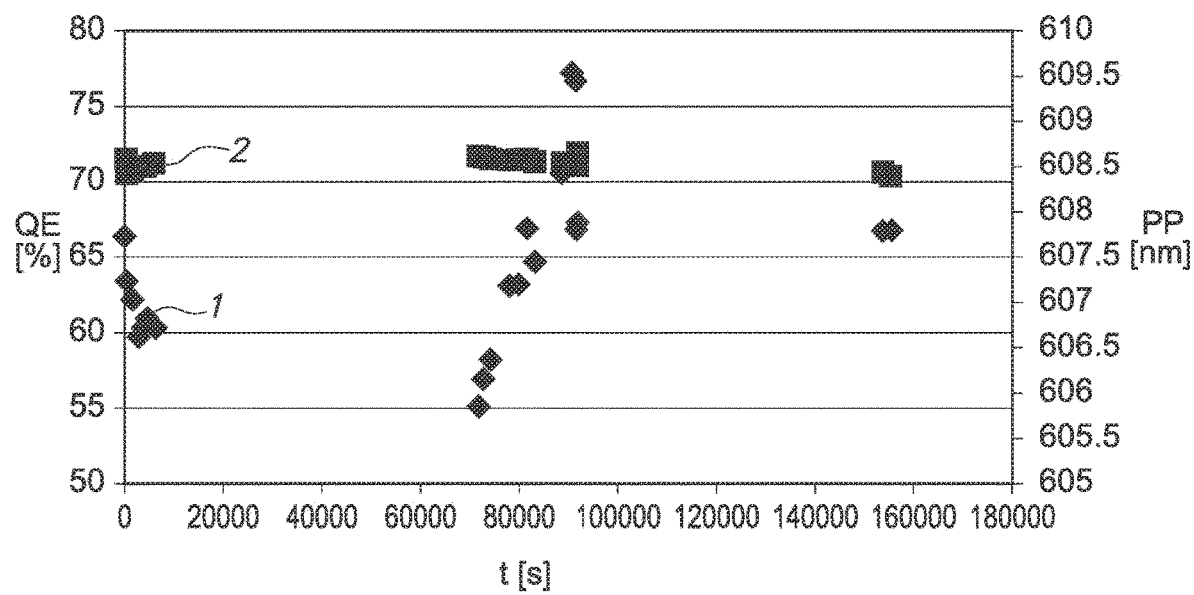
FIG. 7 evolution of QE (diamonds (1)) and emission peak wavelength (squares (2)) over prolonged time (t in seconds; 180000 seconds=50 h) upon exposure of blue light of silica coated QDs where $ZnCl_2$ was added to the ammonia before silica growth, and $Na_2S$ was added after silica growth but before the washing procedure.

When the QE of the same sample was measured again, a QE of 66% was measured with a peak wavelength of 608.5 nm. When this sample was exposed to blue light for prolonged times (up to 2 days) light exposure was observed up to a QE of 76%, while the peak wavelength hardly shifts anymore; see FIG. 7.

Example 6: Application in Different Films of Red QD

A Comparison between a QD dispersion in toluene and in silicone films (wavelength converter element). Samples A-E were treated with 40 μL $ZnCl_2$ (0.4 M) and/or 100 μL $Na_2S$ (0.4 M). A sample F was treated with 40 μL saturated $ZnCl_2$ and 100 μL $Na_2S$ (0.4 M)

Both samples treated with light exposure (LE) had an increase of the QE towards 65-70%. The results are indicated in table 4:

TABLE 4

QD in toluene and in film for red QDs

| Sample | Treatment | Dispersion t = 0 days QE (%) | Film t = 0 days QE (%) | Film t = 1 days QE (%) | Film t = 7 days QE (%) | Dispersion t = 0 days $\lambda_{max}$ (nm) | Film t = 0 days $\lambda_{max}$ (nm) | Film t = 1 days $\lambda_{max}$ (nm) | Film t = 7 days $\lambda_{max}$ (nm) |
|---|---|---|---|---|---|---|---|---|---|
| A | $SiO_2$ | 28.3 | 17.6 | 18.5 | 18.0 | 603.02 | 605.56 | 605.41 | 604.91 |
| B | $SiO_2$ + $ZnCl_2$ | 44.8 | 24.4 | 26.8 | 22.5 | 605.34 | 607.00 | 606.92 | 606.67 |
| C | $SiO_2$ + $Na_2S$ | 36.4 | 30.1 | 31.4 | 32.1 | 602.28 | 603.81 | 603.54 | 602.92 |
| D | $SiO_2$ + $ZnCl_2$ + $Na_2S$ | 48.4 | 28.6 | 30.6 | 30.8 | 605.02 | 605.77 | 605.55 | 605.26 |
| E | $SiO_2$ + $ZnCl_2$ + $Na_2S$ + PB | 42.3 | 43.1 | 45.8 | 47.2 | 604.55 | 605.25 | 605.18 | 604.87 |
| F | $SiO_2$ + $ZnCl_2$ + $Na_2S$ + PB | 56.4 | 24.7 | 27.7 | 28.5 | 609.58 | 609.15 | 609.13 | 608.47 |

It appears that the samples treated with $Na_2S$ show constant QE in films. Further, $ZnCl_2$ induces a redshift and $Na_2S$ induces a blueshift. Further, light exposure has a positive effect on the QE in the films. Sample F has the optimal treatment w.r.t. QE for dispersions, and sample E has the optimal treatment w.r.t. QE for films.

Example 6: Application in Different Films of Green QD

The same experiment was applied, but now with green QDs (NC536A), indicated with samples G-L, see table 5:

TABLE 5

QD in toluene and in film for green QDs

| Sample | Treatment | Dispersion t = 0 days QE (%) | Film t = 0 days QE (%) | t = 1 days QE (%) | t = 7 days QE (%) | Dispersion t = 0 days $\lambda_{max}$ (nm) | Film t = 0 days $\lambda_{max}$ (nm) | t = 1 days $\lambda_{max}$ (nm) | t = 7 days $\lambda_{max}$ (nm) |
|---|---|---|---|---|---|---|---|---|---|
| G | $SiO_2$ | 17.8 | 10.3 | 10.6 | 10.0 | 538.18 | 541.00 | 540.89 | 540.32 |
| H | $SiO_2$ + $ZnCl_2$ | 30.5 | 11.8 | 13.3 | 14.0 | 539.50 | 543.12 | 542.94 | 542.73 |
| I | $SiO_2$ + $Na_2S$ | 21.2 | 20.8 | 22.9 | 24.5 | 537.72 | 539.91 | 539.75 | 539.49 |
| J | $SiO_2$ + $ZnCl_2$ + $Na_2S$ | 45.5 | 16.4 | 17.1 | 18.3 | 537.91 | 538.87 | 538.80 | 538.61 |
| K | $SiO_2$ + $ZnCl_2$ + $Na_2S$ + PB | 42.2 | 26.2 | 26.7 | 28.2 | 538.17 | 539.18 | 539.06 | 538.81 |
| L | $SiO_2$ + $ZnCl_2$ + $Na_2S$ + PB | 45.9 | 20.2 | 21.8 | 24.3 | 545.13 | 544.60 | 544.51 | 544.58 |

Also these samples show constant QE in films. Further, again it was perceived that $ZnCl_2$ induces a redshift and that $Na_2S$ induces a blueshift. Also here it was observed that light exposure has a positive effect on the QE in the films. Sample K has the optimal treatment w.r.t. QE for dispersions and sample L has the optimal treatment w.r.t. QE for films.

The results above demonstrate that silica coating of QDs results in a dramatic drop of QE from 80% to 20-30%. Addition of $ZnCl_2$ and/or $Na_2S$ salts during or after silica growth can improve the QE up to 60% or higher. Light exposure can further increase the QE to above 75%. Without salt addition, light exposure is limited up to 35%. It is suggested that during silica growth, Zn and/or S ions can be removed from the QD surface, resulting in surface defect states, reducing QE. By adding Zinc and/or sulphide salts, (and/)or other relevant salts, during or after silica shell growth, these traps states may be recovered. The changes in QE but also shifts in peak wavelength support the idea that the Zn and/or Sulphide ions, (and/)or other relevant ions, can actually migrate into the silica sphere towards the QDs, and thereby affect the optical properties. It is expected the quantum efficiencies can even be further improved by fine-tuning temperatures, concentrations and salt combinations and or salt addition schemes.

Figure 8:
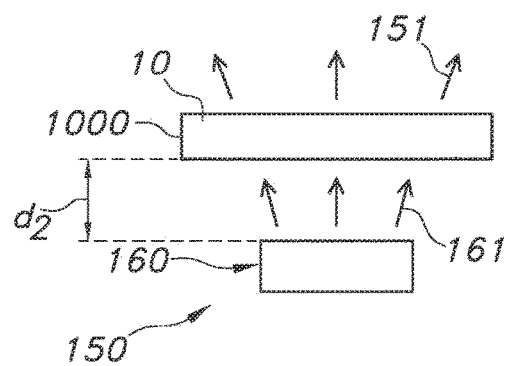
FIG. 8 schematically depicts an embodiment of a lighting device.

Below in table 6, the chemical used are defined:

FIG. 8 depicts a lighting device 150 with a light source 160, configured to generate light source light 161. This light source light 161 is at least partly received with the luminescent material 10, for instance in the form of a layer or body 1000, or comprised by such layer or body 1000. This layer or body may also be indicated as wavelength converter element (see also FIG. 2a). The luminescent material 10 is optically coupled with the light source 160. The luminescent material absorbs at least part of the light source light 161 and converts this light source light 161 into luminescent material light. The light provided by the lighting device 150 is indicated with reference 151. This lighting device light 151 may at least include the light generated by the luminescent material 10 upon said excitation with the light source light 161, but may optionally also include said light source light 161. Reference d2 indicates the distance of the downstream arranged luminescent material, here embedded in the wavelength converter comprising. The distance may be non-zero, indicating e.g. a remote configuration. The distance may optionally also be zero.

FIG. 9a shows a lamp 900 that comprises a lighting device according to FIG. 8. In an alternative embodiment the lamp 900 may comprise multiple lighting devices according to the invention.

FIG. 9b shows a luminaire 950 that comprises a lighting device according to FIG. 8. In an alternative embodiment the

TABLE 6

List of chemicals used

| Chemical | Abbreviation | Manufacturer | Purity | M (g/mol) |
|---|---|---|---|---|
| Cyclohexane | $C_6H_{12}$ | Merck | ≥99.5% | 84.16 |
| Tetraethyl orthosilicate | $Si(OC_2H_5)_4$ | Sigma Aldrich | ≥99.0% | 208.33 |
| Quantum dots | QDs | Crystalplex NC-610-A_5 | — | 50 mg/ml |
| Quantum dots | QDs | Crystalplex NC-536A | | 50 mg/ml |
| Zinc Chloride | $ZnCl_2$ | Sigma Aldrich | ≥97% | 36,315 |
| Igepal ® CO-520 | $(C_2H_4O)_n\cdot C_{15}H_{24}O$, n~5 | Sigma Aldrich | — | 441 |
| Ammonia 35% in water | $NH_4OH$ | Fisher | Electronic (MOS) grade | 35.04 |
| Sodium sulfide nonahydrate | $Na_2S_n\cdot 9H_2O$ | Sigma Aldrich | ≥99.99% | 240.18 |
| Formamide | $CH_3NO$ | Sigma Aldrich | ≥99.5% | 45.04 |
| Ethanol (dehydrated) | $C_2H_6O$ | Bisolv Chimie | semiconductor grade MOS PURANAL | 46.0 | luminaire 950 may comprise multiple lighting devices according to the invention, or one or more lamps according to FIG. 9a.

Example 7: Addition of Cd(NO$_3$)$_2$ during Silica Growth

In yet another example, QDs were coated with a silica shell where of Cd(NO$_3$)$_2$ was added together with the ammonia. In this experiment, 40 µl of Cd(NO$_3$)$_2$ in water added with 120 µl ammonia (35%), at the start of the silica growth. After the silica synthesis was completed (22 hours in the dark without stirring). Next, the reaction mixture was precipitated with ethanol and washed 3 times in ethanol. After washing the reaction mixture was dispersed in 400 µl toluene. The QE of the resulting sample was 71% at a peak wavelength of 609 nm. Note that this peak wavelength is clearly different from the sample described in example 4, where ZnCl$_2$ addition resulted in an initial peak at 606.5 nm.

Example 8: Addition of Cd(NO$_3$)$_2$ during Silica Growth and Na$_2$S Addition after Silica Growth but before the Washing Procedure In yet another example, QDs were coated with a silica shell where Cd(NO$_3$)$_2$ was added together with the ammonia, and Na$_2$S was added after silica growth but before the washing procedure. In this experiment, 0.5 M of Cd(NO$_3$)$_2$ was added with 120 µl of ammonia (35%) solution. After the silica synthesis was completed (22 hours in the dark without stirring), 100 µl of 400 mM Na$_2$S in water was added to the reaction mixture and stirred gently for 30 minutes followed by the addition of 100 µl of 0.8M NaOH for 30 minutes. Next, the reaction mixture was precipitated with ethanol and washed 3 times in ethanol and redispersed in toluene. The QE of the resulting sample was 82% at a peak wavelength of 606 nm. When the quantum dots were incorporated in a silicone film, the QE dropped to 61%. In an accelerated degradation test the samples was measured in an accelerated testing protocol on a LED with drive current of 200 mA and a board temperature of 90° C. After the thermal quench, related to the high operating temperature the emitted intensity dropped <15% over 60 hours as shown in FIG. 10a.

Example 9: Addition of ZnCl$_2$ and Na$_2$S Addition after Silica Growth but before the Washing Procedure In yet another example, QDs were coated with a silica shell where ZnCl$_2$ was added together with the ammonia, and Na$_2$S was added after silica growth but before the washing procedure followed by the addition of base. In this experiment, 50 µl 0.1M ZnCl$_2$ was added with 150 µl of the ammonia (35%) solution at the start of the silica growth. After the silica synthesis was completed (22 hours in the dark without stirring), 100 µl of 400 mM Na$_2$S in water was added to the reaction mixture and stirred gently for 30 minutes followed by addition of 50 µl 0.8 M NaOH and another 30 minutes stirring. Next, the reaction mixture was precipitated with ethanol and washed 3 times in ethanol and redispersed in toluene. The QE of the resulting sample was 58% at a peak wavelength of 605 nm. The emission as a function of time is followed at 200 mA and 90° C., as shown in FIG. 10b. After initial photo brightening and thermal quenching effects, the red emission signal is constant within 10% for at least 150 hours.

Note that the embodiment of Example 9 has a higher stability than the embodiment of Example 8, and also a smaller intensity drop is perceived.

Example 10: Analysis of Amounts of Ions after ZnCl$_2$, Na$_2$S, NaOH Treatment of QDs from Example 1 and Example 9

ICP-MS analysis of a sample prepared according to example 1 was carried out and compared to that of sample prepared according to example 9.

In order to release the elements of interest out of the matrix, the sample is destructed using a microwave digestion procedure. After dissolution, the sample is diluted to a known volume and a semi-quantitative measurement was performed in order to determine the present elements by means of Inductively Coupled Plasma-Optical Emission Spectrometry (ICP-OES). Subsequently the determined elements are determined more precisely by means of ICP-OES.

During ICP-OES analysis, the sample solutions are fed through a nebulizer. This produces an aerosol which is led into an argon plasma. In this plasma the solution is evaporated, atomized and excited, which produces element specific emission. The intensity and wavelength of the emission is used to determine the amounts of Cd, K, Na, S, Si and Zn present. Calibration is performed by comparison with the intensities produced by a matrix matched blank and at least four matrix matched calibration standard solutions (obtained by dilution of certified reference solutions).

Each blank, calibration standard and sample solution contains corresponding amounts of internal standards to correct for system variations during measurement. Each ICP-OES measurement consists of multiple replicates and each is measured using several wavelengths. For quality control blanks and spike recovery experiments are taken along.

The results of the quantitative ICP-OES analyses are presented in table 7. The concentrations are expressed in ratios of weight percentages (wt %) relative to the amount of silicon. Each sample is analyzed in triplicate. The amounts of Na, S and Zn, are significantly higher for Example 9 compared to Example 1. The Cd and K content are the same within experimental error while the amounts of Na, S and Zn, reach values up to 10-20% of the amount if Si

TABLE 7 weight of Cd, K, Na, S and Zn relative to the weight of silicon.

| Element | Example 1 | Example 9 |
|---|---|---|
| Cd | 4.3 | 4.5 |
| Na | 0.3 | 17.9 |
| S | 1.8 | 11.2 |
| Si | 100 | 100 |
| Zn | 2.6 | 15.7 |

The invention enables efficient (QD-converted) LED light sources at high flux densities, for example LED lamps, spot lights, outdoor lighting, automotive lighting and/or laser applications.

The invention claimed is:

1. A method for the production of a luminescent material based on coated quantum dots, the method comprising:
   providing luminescent quantum dots in a liquid medium
      wherein the luminescent quantum dots have an outer layer comprising first element comprising cations and second element comprising anions; and providing in a coating process a coating on the outer layer of the quantum dots in the liquid medium, wherein the coating comprises at least one of a silica coating, a titania coating, an alumina coating, and a zirconia coating;

wherein during the coating process, or after the coating process, or during and after the coating process, the liquid medium comprises one or more of a third element comprising ion and a fourth element comprising ion, wherein the first element and the third element belong to the same group of the periodic system, and are selected from the group of metal elements, wherein the second element and the fourth element belong to the same group of the periodic system, and are selected from the group of non-metal elements, and wherein the first element and the third element are each independently selected from the group consisting of Zn and Cd, and wherein the second element and the fourth element are each independently selected from the group consisting of S, Se and Te.

2. The method according to claim 1, wherein the one or more of the third element and the fourth element are available in the liquid medium in a concentration of at least of 10 mM.

3. The method according to claim 1, wherein one or more of the following applies: the third element and the first element are a same element, and the fourth element and the second element are a same element.

4. The method according to claim 1, wherein the coating process is executed in micelles containing said quantum dots.

5. The method according to claim 1, wherein during the coating process the liquid medium comprises the third element comprising ion and does substantially not comprise the fourth element comprising ion, and wherein after the coating process the liquid medium comprises the fourth element comprising ion.

6. The method according to claim 1, wherein the coated quantum dots obtainable with the method according to claim 1 have a luminescence maximum wavelength that is shifted relative to a luminescence maximum wavelength of coated quantum dots obtainable with such method in the absence of the third element comprising ion and fourth element comprising ion.

7. The method according to claim 1, further comprising embedding the coated quantum dots in a host material to provide a wavelength converter element, wherein the host material comprises a silicone.

8. A luminescent material based on coated quantum dots, the luminescent material comprising luminescent quantum dots having an outer layer comprising first element comprising cations and second element comprising anions; and a coating arranged on said outer layer, wherein the coating comprises at least one of a silica coating, a titania coating, an alumina coating, and a zirconia coating, and wherein the coating further comprises one or more of a third element and a fourth element, wherein the first element and the third element belong to the same group of the periodic system, and wherein the second element and the fourth element belong to the same group of the periodic system, and wherein the first element and the third element are each independently selected from the group consisting of Zn and Cd, and wherein the second element and the fourth element are each independently selected from the group consisting of S, Se and Te.

9. The luminescent material according to claim 8, wherein one or more of the following applies: the third element and the first element are a same element, and the fourth element and the second element are a same element.

10. The luminescent material according to claim 8, wherein the one or more of a third element and a fourth element are available in the coating in an amount of at least 100 ppm, respectively.

11. The luminescent material according to claim 8, wherein the one or more of a third element and a fourth element are available in the coating in a weight ratio to silicon in the range of 1:100-25:100, respectively.

12. The luminescent material according to claim 8, wherein the quantum dots have a shape selected from the group consisting of a sphere, a cube, a rod, a wire, a disk, and a multi-pod, wherein the coating has a thickness in the range of 1-50 nm, wherein the quantum dots are of the core-shell type with a core material differing from the shell material, wherein the core material is selected from the group consisting of ZnS, ZnSe, CdS, CdSe and InP, wherein the shell material is selected from the group consisting of ZnS, ZnSe, CdS, and CdSe, and wherein the third element is selected from the group consisting of Zn and Cd, and wherein A4 is selected from the group consisting of S and Se.

13. A wavelength converter element comprising a host material with the luminescent material embedded therein, the luminescent material according to claim 8 or obtainable by the method according to claim 1.

14. The wavelength converter element according to claim 13, wherein the host material comprises a silicone.

15. A lighting device comprising a light source and a luminescent material, as defined in claim 8, or a luminescent material obtainable by the method according to claim 1, or a wavelength converter element comprising said luminescent material, wherein the light source is configured to illuminate the luminescent material.

16. A lamp comprising at least one lighting device according to claim 15.

17. A luminaire comprising at least one lighting device according to claim 15 or at least one lamp according to claim 16.

* * * * *